(12) United States Patent
Seo et al.

(10) Patent No.: US 11,711,935 B2
(45) Date of Patent: Jul. 25, 2023

(54) DISPLAY PANEL

(71) Applicant: Samsung Display Co., Ltd., Yongin-si (KR)

(72) Inventors: Seokhoon Seo, Yongin-si (KR); Seungjae Lee, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 166 days.

(21) Appl. No.: 17/221,703

(22) Filed: Apr. 2, 2021

(65) Prior Publication Data
US 2022/0006041 A1    Jan. 6, 2022

(30) Foreign Application Priority Data
Jul. 6, 2020    (KR) .................. 10-2020-0083044

(51) Int. Cl.
| | |
|---|---|
| *H10K 50/822* | (2023.01) |
| *H10K 50/15* | (2023.01) |
| *H10K 50/16* | (2023.01) |
| *H10K 50/17* | (2023.01) |
| *H10K 50/844* | (2023.01) |
| *H10K 59/131* | (2023.01) |
| *H10K 71/00* | (2023.01) |
| *H10K 59/122* | (2023.01) |
| *H10K 59/124* | (2023.01) |

(52) U.S. Cl.
CPC ........... *H10K 50/822* (2023.02); *H10K 50/15* (2023.02); *H10K 50/16* (2023.02); *H10K 50/17* (2023.02); *H10K 50/171* (2023.02); *H10K 50/844* (2023.02); *H10K 59/131* (2023.02); *H10K 71/00* (2023.02); *H10K 59/122* (2023.02); *H10K 59/124* (2023.02)

(58) Field of Classification Search
CPC ........... H01L 51/5225; H01L 27/3276; H10K 50/822
See application file for complete search history.

(56) References Cited

U.S. PATENT DOCUMENTS 9,153,631 B2 * 10/2015 Sung ................. H01L 51/52
9,391,296 B2 *  7/2016 Park ................ H01L 51/5253
(Continued)

FOREIGN PATENT DOCUMENTS

JP           5302345 B2    10/2013
KR    10-2017-0003244 A    1/2017
(Continued)

*Primary Examiner* — Caleb E Henry
(74) *Attorney, Agent, or Firm* — Lewis Roca Rothgerber Christie LLP

(57) ABSTRACT

A display panel includes: a display area and a peripheral area outside the display area; a substrate; a plurality of pixel electrodes spaced apart from each other on the substrate in the display area; a plurality of emission layers respectively arranged on the plurality of pixel electrodes; an opposite electrode on the plurality of emission layers and overlapping the display area; and a thin-film encapsulation layer on the opposite electrode and comprising at least one organic encapsulation layer and at least one inorganic encapsulation layer, wherein edges of the opposite electrode comprise a concave edge recessed from the peripheral area toward the display area and a convex edge protruding from the display area toward the peripheral area in a plan view.

20 Claims, 14 Drawing Sheets

(56) References Cited

U.S. PATENT DOCUMENTS

| | | | |
|---|---|---|---|
| 10,777,771 B2* | 9/2020 | Lee | H01L 51/5253 |
| 11,088,232 B2* | 8/2021 | Choi | H01L 51/5246 |
| 2012/0200820 A1 | 8/2012 | Sato et al. | |
| 2018/0033830 A1* | 2/2018 | Kim | G06F 3/0443 |
| 2018/0286935 A1* | 10/2018 | Kondo | H10K 59/125 |
| 2019/0043939 A1* | 2/2019 | Ozawa | H10K 59/131 |
| 2019/0136365 A1 | 5/2019 | Kawasaki et al. | |
| 2019/0165312 A1 | 5/2019 | Bae et al. | |
| 2019/0198587 A1 | 6/2019 | Park et al. | |
| 2019/0250749 A1* | 8/2019 | Aoki | G06F 3/04166 |
| 2019/0334125 A1* | 10/2019 | Hosono | H10K 71/00 |
| 2020/0083479 A1* | 3/2020 | Park | H10K 59/131 |
| 2020/0105848 A1* | 4/2020 | Nozawa | H10K 59/35 |
| 2020/0357872 A1* | 11/2020 | Kim | H01L 29/66757 |
| 2021/0005142 A1* | 1/2021 | Tsuboi | H10K 59/131 |

FOREIGN PATENT DOCUMENTS

| | | |
|---|---|---|
| KR | 10-2019-0021231 A | 3/2019 |
| KR | 10-2019-0064254 A | 6/2019 |
| KR | 10-2019-0076093 A | 7/2019 |

* cited by examiner

DISPLAY PANEL

CROSS-REFERENCE TO RELATED APPLICATION

The present application claims priority to and the benefit of Korean Patent Application No. 10-2020-0083044, filed on Jul. 6, 2020, in the Korean Intellectual Property Office, the entire disclosure of which is incorporated herein by reference.

BACKGROUND

1. Field

Aspects of one or more example embodiments relate to a display panel and a method and mask for manufacturing the same.

2. Description of Related Art

With the growth of information-oriented societies, there is an increasing demand for a variety of display apparatuses for displaying images. In the field of display apparatuses, bulky cathode-ray tubes (CRTs) have been rapidly replaced with flat-panel display devices (FPDs) that are relatively thin, lightweight and made in large sizes. Examples of FPDs include liquid-crystal displays (LCDs), plasma display panels (PDPs), organic light-emitting displays (OLEDs), and electrophoretic displays (EPDs).

A display panel of a display apparatus may include a display area where an images are displayed and a peripheral area, that is, a non-display area, where an images are not displayed. Recently, research to expand a display area by reducing the area of a non-display area, that is, a dead space, has been actively conducted.

The above information disclosed in this Background section is only for enhancement of understanding of the background and therefore the information discussed in this Background section does not necessarily constitute prior art.

SUMMARY

Aspects of one or more example embodiments relate to a display panel and a method and mask for manufacturing the same, and for example, to a display panel in which a dead space is relatively reduced and a mask for manufacturing the display panel.

A display panel may be sealed by a thin-film encapsulation layer including an organic material layer, and an effort to reduce an area occupied by the organic material layer of the thin-film encapsulation layer in a non-display area may be made in order to reduce the area of the non-display area. One or more embodiments include a display panel for reducing a dead space. However, the above-described characteristics are merely examples, and do not limit the scope of the present disclosure.

Additional aspects will be set forth in part in the description which follows and, in part, will be more apparent from the description, or may be learned by practice of the presented embodiments of the disclosure.

According to one or more example embodiments, a display panel includes a display area and a peripheral area located outside the display area, a substrate, a plurality of pixel electrodes located on the substrate in the display area to be spaced apart from one another, a plurality of emission layers respectively located on the plurality of pixel electrodes, an opposite electrode located on the plurality of emission layers and overlapping the display area, and a thin-film encapsulation layer located on the opposite electrode and including at least one organic encapsulation layer and at least one inorganic encapsulation layer, wherein edges of the opposite electrode include a concave edge recessed from the peripheral area toward the display area and a convex edge protruding from the display area toward the peripheral area in a plan view.

According to some example embodiments, the display panel may further include a plurality of barriers located in the peripheral area to be spaced apart from one another, wherein a first portion of a barrier from among the plurality of barriers overlaps the opposite electrode, and a second portion of the barrier does not overlap the opposite electrode.

According to some example embodiments, the at least one inorganic encapsulation layer may directly contact the second portion of the barrier.

According to some example embodiments, the display panel may further include a conductive layer located in the peripheral area and including a plurality of holes, wherein the plurality of barriers overlap the plurality of holes.

According to some example embodiments, the display panel may further include a common power supply line located in the peripheral area, wherein the opposite electrode and the common power supply line are electrically connected by the conductive layer.

According to some example embodiments, the conductive layer may include the same material as a material of the plurality of pixel electrodes.

According to some example embodiments, the at least one organic encapsulation layer may overlap the concave edge of the opposite electrode.

According to some example embodiments, the concave edge of the opposite electrode may have a quadrangular shape, a trapezoidal shape, a triangular shape, or a shape like a part of a circle or a part of an ellipse in a plan view.

According to some example embodiments, the display panel may further include a common layer located between the plurality of pixel electrodes and the opposite electrode, wherein edges of the common layer include a concave edge recessed from the peripheral area toward the display area and a convex edge protruding from the display area toward the peripheral area in a plan view.

According to some example embodiments, the edges of the common layer may have the same shape as a shape of the edges of the opposite electrode in a plan view.

According to some example embodiments, concave areas respectively formed by the concave edge of the common layer and the concave edge of the opposite electrode may overlap each other.

According to some example embodiments, the display panel may further include a capping layer located between the opposite electrode and the thin-film encapsulation layer, wherein edges of the capping layer include a concave edge recessed from the peripheral area toward the display area and a convex edge protruding from the display area toward the peripheral area in a plan view.

According to some example embodiments, the edges of the capping layer may have the same shape as a shape of the edges of the opposite electrode in a plan view.

According to some example embodiments, concave areas respectively formed by the concave edge of the capping layer and the concave edge of the opposite electrode may overlap each other.

According to some example embodiments, the display panel may further include a partition wall located in the peripheral area to be outside the plurality of barriers.

According to some example embodiments, the edges of the opposite electrode may be located between the partition wall and the plurality of pixel electrodes in a plan view.

According to some example embodiments, the display panel may further include a pixel-defining layer located on the plurality of pixel electrodes and including openings respectively corresponding to the plurality of pixel electrodes, wherein the plurality of barriers include the same material as a material of the pixel-defining layer.

According to some example embodiments, an edge of the at least one organic encapsulation layer may be located between adjacent barriers from among the plurality of barriers.

According to some example embodiments, the convex edge of the opposite electrode may be closer to an edge of the substrate than the edge of the at least one organic encapsulation layer.

According to some example embodiments, the concave edge of the opposite electrode may be farther from an edge of the substrate than the edge of the at least one organic encapsulation layer.

Other features and characteristics of embodiments according to the present disclosure will become more apparent from the drawings, the claims, and the detailed description.

These general and example embodiments may be implemented by using a system, a method, a computer program, or a combination thereof.

BRIEF DESCRIPTION OF THE DRAWINGS

The above and other aspects, features, and characteristics of certain embodiments of the disclosure will be more apparent from the following description taken in conjunction with the accompanying drawings, in which.

DETAILED DESCRIPTION

Figure 1:
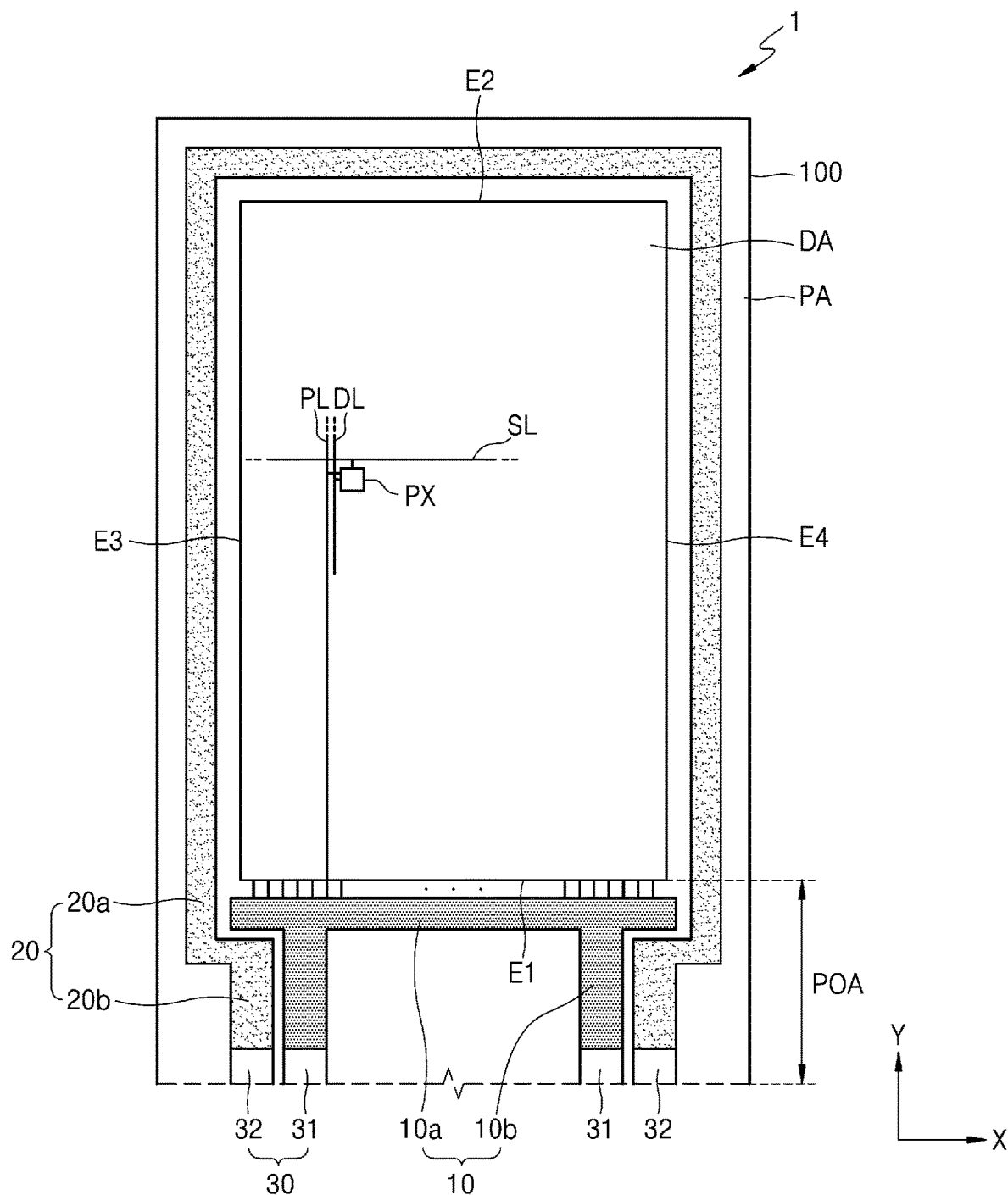
FIG. 1 is a plan view of a display panel according to some example embodiments.

Reference will now be made in detail to aspects of some example embodiments, which are illustrated in the accompanying drawings, wherein like reference numerals refer to like elements throughout. In this regard, embodiments according to the present disclosure may have different forms and should not be construed as being limited to the descriptions set forth herein. Accordingly, the embodiments are merely described below, by referring to the figures, to explain aspects of the present description. As used herein, the term "and/or" includes any and all combinations of one or more of the associated listed items. Throughout the disclosure, the expression "at least one of a, b or c" indicates only a, only b, only c, both a and b, both a and c, both b and c, all of a, b, and c, or variations thereof.

The present disclosure may include various embodiments and modifications, and example embodiments thereof will be illustrated in the drawings and will be described herein in more detail. The characteristics and features of embodiments according to the present disclosure and the accompanying methods thereof will become more apparent from the following description of the embodiments, taken in conjunction with the accompanying drawings. However, embodiments according to the present disclosure are not limited to the embodiments described below, and may be embodied in various modes.

Reference will now be made in more detail to aspects of some example embodiments, which are illustrated in the accompanying drawings. In the drawings, the same elements are denoted by the same reference numerals, and a repeated explanation thereof will not be given.

It will be understood that although the terms "first," "second," etc. may be used herein to describe various elements, these elements should not be limited by these terms. These terms are only used to distinguish one element from another.

As used herein, the singular forms "a," "an," and "the" are intended to include the plural forms as well, unless the context clearly indicates otherwise.

It will be further understood that the terms "comprises" and/or "comprising" used herein specify the presence of stated features or elements, but do not preclude the presence or addition of one or more other features or elements.

It will be understood that when a layer, region, or element is referred to as being "formed on" another layer, area, or element, it may be directly or indirectly formed on the other layer, region, or element. That is, for example, intervening layers, regions, or elements may be present.

Sizes of elements in the drawings may be exaggerated or contracted for convenience of explanation. In other words, because sizes and thicknesses of components in the drawings are arbitrarily illustrated for convenience of explanation, the following embodiments are not limited thereto.

When a certain embodiment may be implemented differently, a specific process order may be performed differently from the described order. For example, two consecutively described processes may be performed substantially at the same time or performed in an order opposite to the described order.

"A and/or B" is used herein in order to select only A, select only B, or select both A and B. "At least one of A and B" is used herein in order to select only A, select only B, or select both A and B.

It will be understood that when a layer, region, or element is referred to as being "connected," the layer, the region, or the element may be directly connected or may be indirectly connected with intervening layers, regions, or elements therebetween. For example, when a layer, a region, or an element is electrically connected, the layer, the region, or the element may be directly electrically connected and/or may be indirectly electrically connected with intervening layers, regions, or elements therebetween.

In the following embodiments, the x-axis, the y-axis and the z-axis are not limited to three axes of the rectangular coordinate system, and may be interpreted in a broader sense. For example, the x-axis, the y-axis, and the z-axis may be perpendicular to one another, or may represent different directions that are not perpendicular to one another.

FIG. 1 is a plan view of a display panel according to some example embodiments.

Referring to FIG. 1, a display panel 1 may include a substrate 100, and elements included in the display panel 1 may be located on the substrate 100. The display panel 1 may include a display area DA and a peripheral area SA located outside (e.g., outside a periphery or outside a footprint of) the display area DA.

A plurality of pixels PX may be located in the display area DA, and the display area DA may provide or display a certain image through light emitted by the plurality of pixels PX. Each of the plurality of pixels PX may emit red light, green light, or blue light. According to some example embodiments, each of the plurality of pixels PX may emit red light, green light, blue light, or white light. Each pixel PX may include a light-emitting element such as an organic light-emitting diode (OLED).

Each pixel PX may be connected to a scan line SL extending in a first direction (e.g., an x-direction) and a data line DL extending in a second direction (e.g., a y-direction) intersecting the first direction. The data line DL may intersect the scan line SL.

The peripheral area PA may entirely or partially surround the display area DA. The peripheral area PA where the pixels PX are not located may correspond to a non-display area where images are not displayed. According to some example embodiments, a scan driver for applying a scan signal to the scan line SL and a data driver for applying a data signal to the data line DL may be located in the peripheral area PA.

A driving power supply line 10 and a common power supply line 20 may be located in the peripheral area PA. The driving power supply line 10 may be located to correspond to a first side E1 of the display area DA, and the common power supply line 20 may be located to correspond to second through fourth sides E2, E3, and E4 of the display area DA. The driving power supply line 10 may be located between the first side E1 of the display area DA and a pad unit 30, and the common power supply line 20 may partially surround the display area DA in a loop shape in which a portion corresponding to the first side E1 is open.

The driving power supply line 10 includes a first body portion 10a extending along the first side E1 of the display area DA. The first body portion 10a may extend in the x-direction along the first side E1 of the display area DA, and may have a length equal to or greater than that of the first side E1.

The first body portion 10a may be integrally formed with a first connecting portion 10b extending in the y-direction from the first body portion 10a. The first connecting portion 10b may extend in the y-direction in a pull-off area POA toward the pad unit 30. The pull-off area POA that is located between a side of the substrate 100 and the first side E1 of the display area DA adjacent to the pad unit 30 in the peripheral area PA may be an area from the first side E1 of the display area DA to the pad unit 30. The first connecting portion 10b may extend from the first body portion 10a toward an edge of the substrate 100, and may be connected to a first terminal 31 of the pad unit 30.

The common power supply line 20 may include a second body portion 20a extending along the second through fourth sides E2, E3, and E4 of the display area DA. The second body portion 20a may partially surround the display area DA along the second through fourth sides E2, E3, and E4 other than the first side E1 of the display area DA. The second side E2 is located opposite to the first side E1, and the third and fourth sides E3 and E4 connect the first side E1 and the second side E2 and are located opposite to each other. The second body portion 20a may surround the display area DA, and may wrap around both ends of the first body portion 10a.

The second body portion 20a may be integrally formed with a second connecting portion 20b extending in the y-direction from the second body portion 20a. The second connecting portion 20b may extend in the y-direction in the pull-off area POA toward the pad unit 30. The second connecting portion 20b may extend parallel to the first connecting portion 10b in the pull-off area POA, and may be connected to a second terminal 32 of the pad unit 30.

The pad unit 30 may correspond to an end portion of the substrate 100, may be exposed without being covered by an insulating layer or the like and may be connected to a controller through a flexible printed circuit board or the like. A signal or power of the controller may be provided to the pixels PX through the pad unit 30.

The driving power supply line 10 may apply a driving power supply voltage ELVDD (see FIG. 2) to each pixel PX, and the common power supply line 20 may apply a common power supply voltage ELVSS (see FIG. 2) to each pixel PX. The driving power supply voltage ELVDD may be applied to each pixel PX through a driving voltage line PL connected to the driving power supply line 10. The common power supply voltage ELVSS may be applied to, for example, an opposite electrode of the organic light-emitting diode. The opposite electrode of the organic light-emitting diode and the second body portion 20a of the common power supply line 20 may be connected in the peripheral area PA to transmit the common power supply voltage ELVSS.

Figure 2:
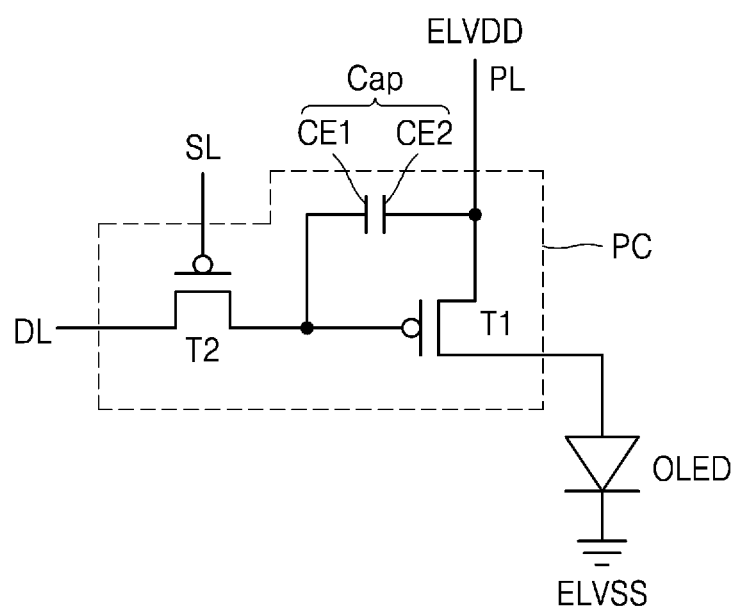
FIG. 2 is an equivalent circuit diagram of a pixel circuit connected to a light-emitting element included in a display apparatus according to some example embodiments.

FIG. 2 is an equivalent circuit diagram of a pixel circuit connected to a light-emitting element included in a display apparatus according to some example embodiments.

Referring to FIG. 2, a light-emitting element may be connected to a pixel circuit PC, and the pixel circuit PC may include a thin-film transistor and a storage capacitor connected to the scan line SL, the data line DL, and/or the driving voltage line PL. The light-emitting element may include a light-emitting diode, for example, an organic light-emitting diode OLED.

The pixel circuit PC may include a plurality of thin-film transistors and a storage capacitor. According to some example embodiments, the pixel circuit PC may include a first thin-film transistor T1, a second thin-film transistor T2, and a storage capacitor Cap.

The second thin-film transistor T2 that is a switching thin-film transistor may be connected to the scan line SL and the data line DL, and may transmit a data voltage (or a data signal) input from the data line DL to the first thin-film transistor T1 based on a switching voltage (or a switching signal) input from the scan line SL.

The storage capacitor Cap may be connected to the second thin-film transistor T2 and the driving voltage line PL, and may store a voltage corresponding to a difference between a voltage received from the second thin-film transistor T2 and the driving power supply voltage ELVDD supplied to the driving voltage line PL. The storage capacitor Cap may include at least two electrodes, for example, a lower electrode CE1 and an upper electrode CE2.

The first thin-film transistor T1 that is a driving thin-film transistor may be connected to the driving voltage line PL and the storage capacitor Cap, and may control driving current flowing through the organic light-emitting diode OLED from the driving voltage line PL in response to a value of the voltage stored in the storage capacitor Cap. The organic light-emitting diode OLED may emit light having a certain luminance due to the driving current. An opposite electrode (e.g., a cathode) of the organic light-emitting diode OLED may receive the common power supply voltage ELVSS.

Although the pixel circuit PC is illustrated as including two thin-film transistors and one storage capacitor in FIG. 2, embodiments according to the present disclosure are not limited thereto, and the pixel circuit PC may include additional components or fewer components without departing from the spirit and scope of embodiments according to the present disclosure. For example, the pixel circuit PC may include three or more thin-film transistors and/or two or more storage capacitors. According to some example embodiments, the pixel circuit PC may include seven thin-film transistors and one storage capacitor. The number of thin-film transistors and storage capacitors may be changed in various ways according to a design of the pixel circuit PC. However, for convenience of explanation, the following will be described assuming that the pixel circuit PC includes two thin-film transistors and one storage capacitor.

Figure 3A:
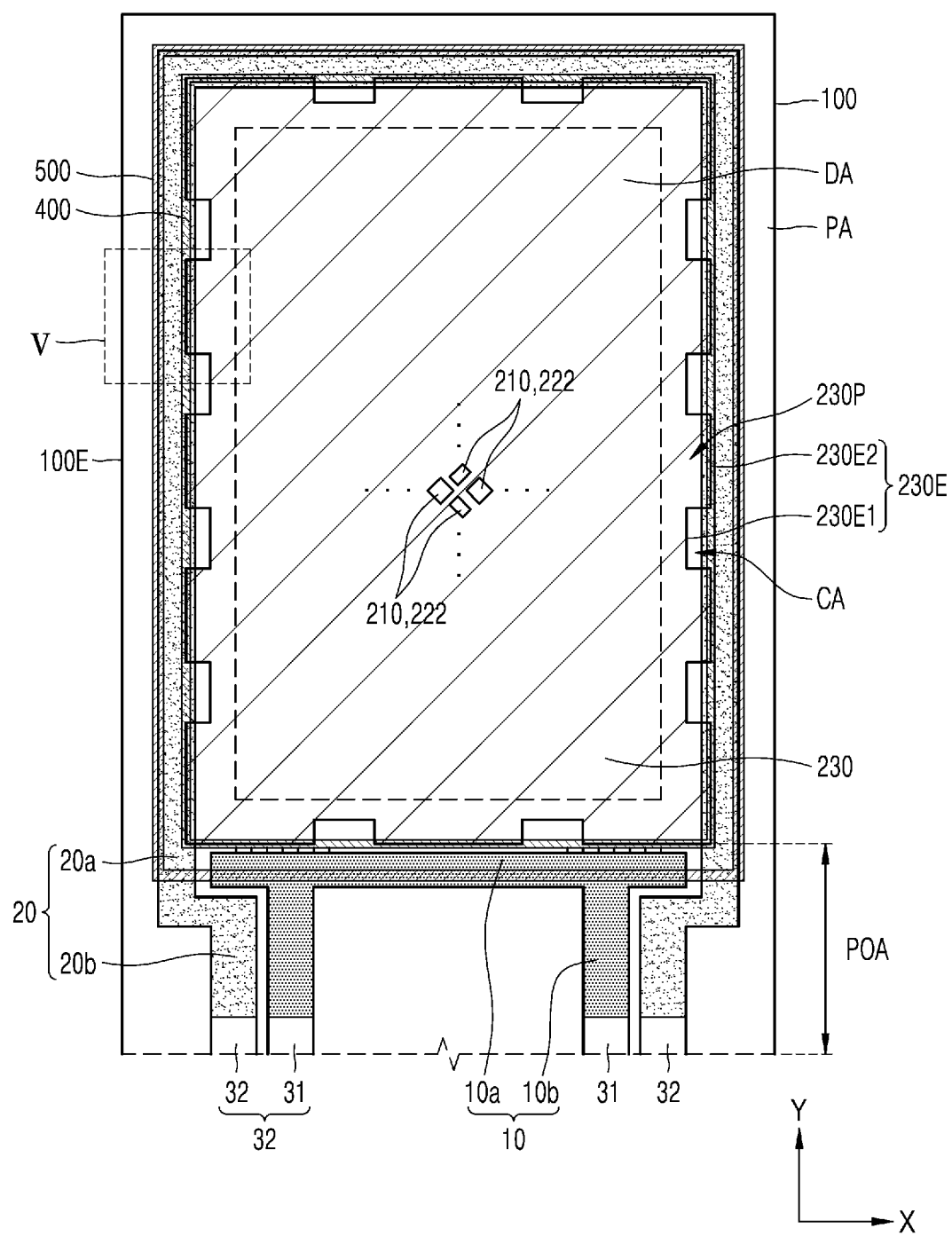
FIG. 3A is a plan view illustrating some elements of a display panel according to some example embodiments.

FIG. 3A is a plan view illustrating some elements, e.g., an opposite electrode and elements around the opposite electrode, in a display panel according to some example embodiments.

Referring to FIG. 3A, the display panel 1 may include a plurality of pixel electrodes 210, a plurality of emission layers 222, and an opposite electrode 230. The plurality of pixel electrodes 210 may be located in the display area DA to be spaced apart from one another, and the plurality of emission layers 222 may be respectively located on the plurality of pixel electrodes 210. The opposite electrode 230 may be located on the plurality of pixel electrodes 210 and the plurality of emission layers 222, and may overlap the display area DA. The opposite electrode 230 may extend from the display area DA to the peripheral area PA, and an edge 230E of the opposite electrode 230 may be located in the peripheral area PA.

A barrier 400 and a partition wall 500 may be located in the peripheral area PA of the display panel 1.

The barrier 400 and the partition wall 500 may each have a loop shape entirely surrounding the display area DA. The barrier 400 and/or the partition wall 500 may partially overlap the common power supply line 20, and a part of the barrier 400 may overlap the opposite electrode 230.

The opposite electrode 230 may be formed as a single body to overlap the display area DA. For example, the area of the opposite electrode 230 may be greater than the area of the display area DA, and an edge portion of the opposite electrode 230 may overlap the part of the barrier 400 in the peripheral area PA.

The edge 230E of the opposite electrode 230 may have an uneven pattern in a plan view, for example, when seen in a direction perpendicular to a surface of the substrate 100. That is, the edge 230E of the opposite electrode 230 may include a concave edge 230E1 recessed from the peripheral area PA toward the display area DA and a convex edge 230E2 protruding from the display area DA toward the peripheral area PA in a plan view. The edge 230E of the opposite electrode 230 may have an uneven pattern in which the concave edge 230E1 and the convex edge 230E2 are repeatedly arranged.

Because the edge 230E of the opposite electrode 230 has the uneven pattern, a portion of the barrier 400 may overlap the opposite electrode 230, and another portion of the barrier 400 may not overlap the opposite electrode 230. In detail, a portion of the barrier 400 may overlap a convex portion 230P of the opposite electrode 230. In contrast, another portion of the barrier 400 is located in a concave area CA located between the convex portions 230P of the opposite electrode 230, and thus the other portion of the barrier 400 does not overlap the opposite electrode 230.

In order to reduce the area of the peripheral area PA of the display panel 1, that is, a dead space, some example embodiments may accurately control the flow of a liquid organic material for forming the organic encapsulation layer 320. The barrier 400 may be used not only to prevent or reduce instances of the liquid organic material for forming the organic encapsulation layer 320 flowing toward an edge of the substrate 100 but also to identify an area where the liquid organic material is formed. For example, the liquid organic material for forming the organic encapsulation layer 320 may be applied to the display panel 1 by using a jetting method, and in this case, a position of the liquid organic material may be identified by using a shade in an optical image of the display panel 1. The shade in the optical image may be caused by a level difference (e.g. a step) between the barrier 400 and a structure and/or layer under the barrier 400.

According to some example embodiments, because a part of the barrier 400 does not overlap the opposite electrode 230, a shade difference in the optical image may be more significant, and thus the area where the liquid organic material for forming the organic encapsulation layer 320 is located may be more easily identified. As a comparative example, when the barrier 400 is entirely covered by the opposite electrode 230, a shade difference in the optical image is insignificant and it is difficult to control a position of the liquid organic material. However, according to some example embodiments, because the edge 230E of the opposite electrode 230 has an uneven structure, the liquid organic material may be more precisely controlled.

Figure 3B:
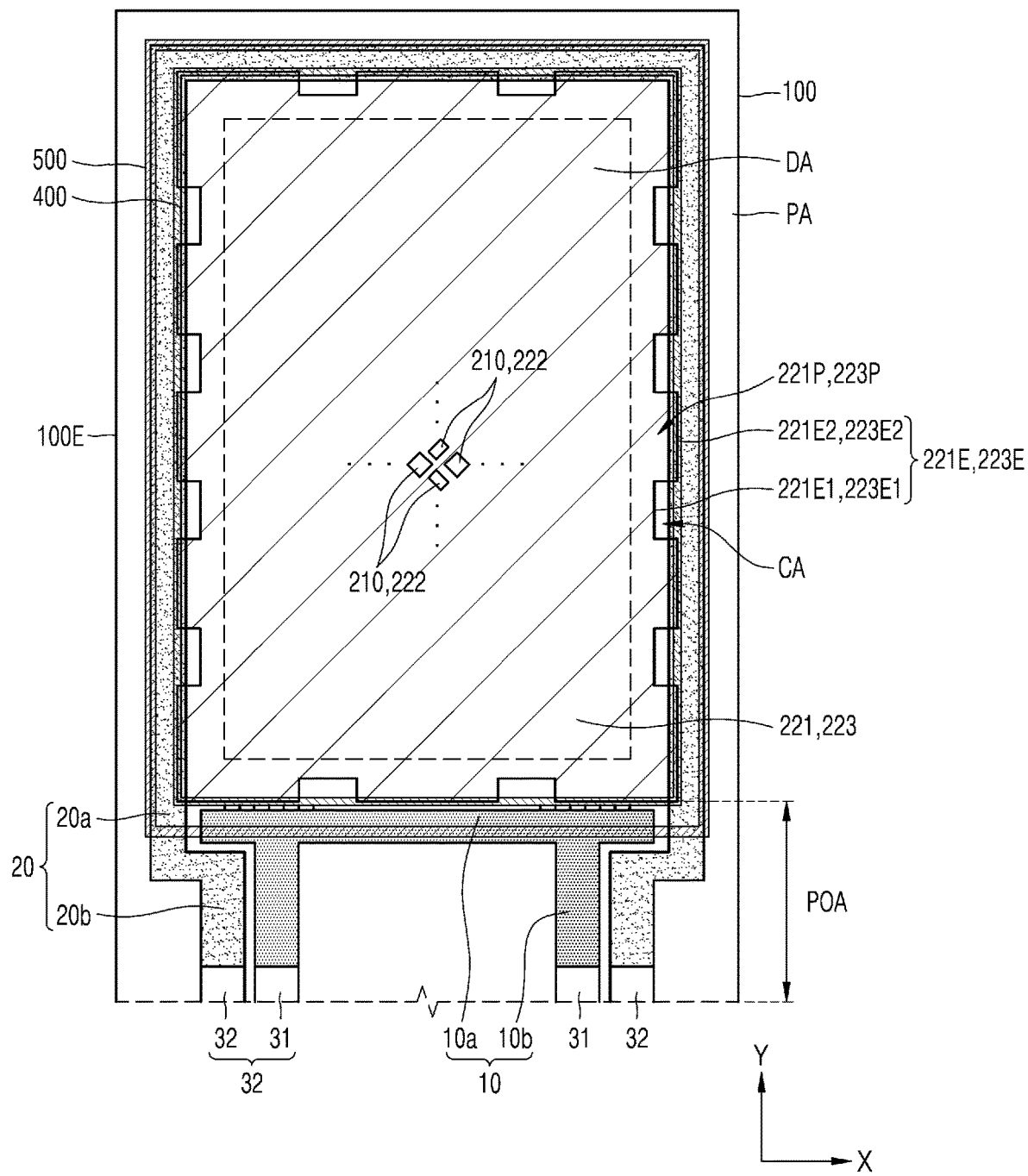
FIG. 3B is a plan view illustrating some elements of a display panel according to some example embodiments.
Figure 3C:
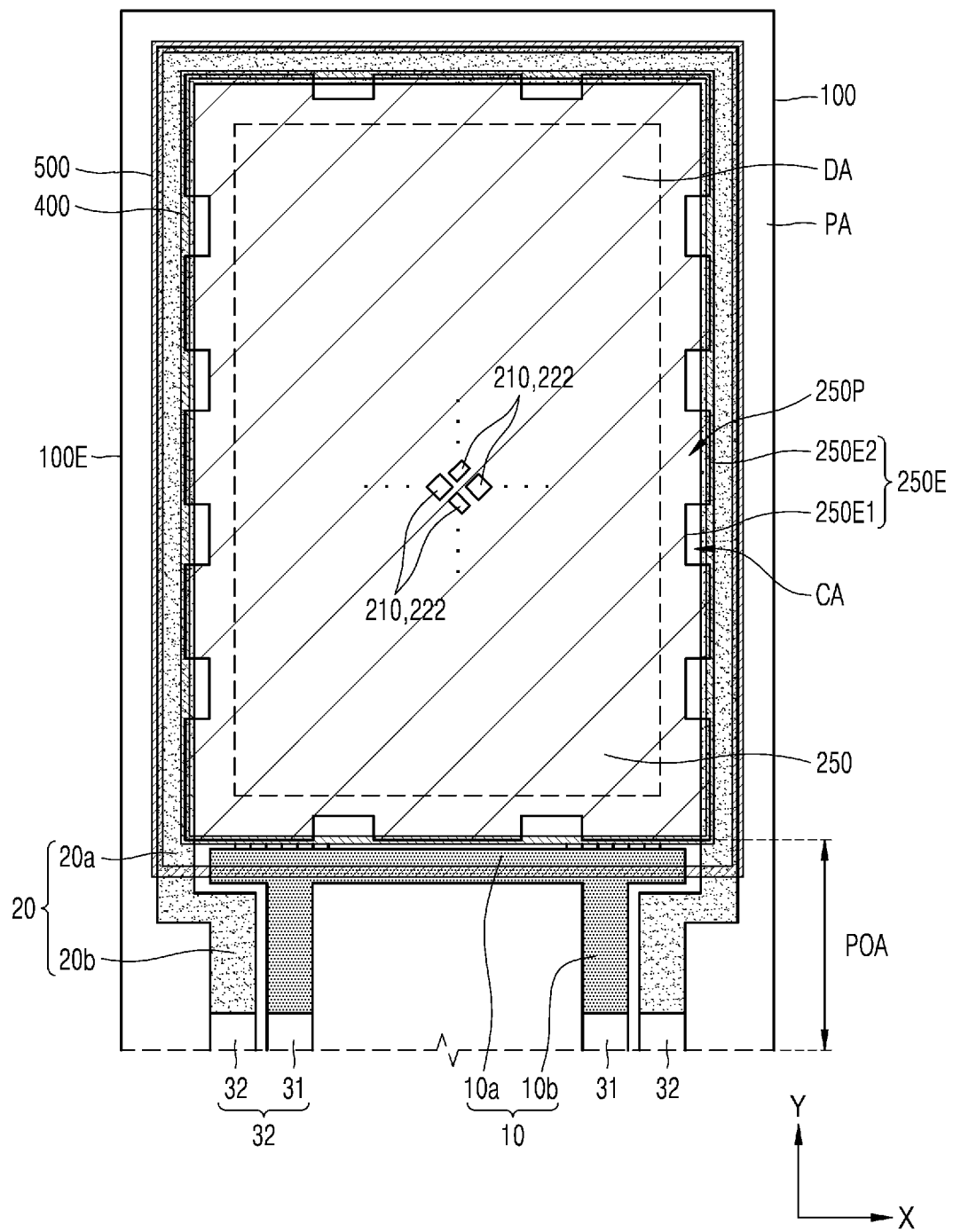
FIG. 3C is a plan view illustrating some elements of a display panel according to some example embodiments.

FIG. 3B is a plan view illustrating some elements, e.g., a common layer located between pixel electrodes and an opposite electrode and elements around the common layer, in a display panel according to some example embodiments. FIG. 3C is a plan view illustrating some elements, e.g., a capping layer located on an opposite electrode and elements around the capping layer, in a display panel according to some example embodiments.

Referring to FIGS. 3B and 3C, common layers 221 and 223 and a capping layer 250 may each have a planar shape and arrangement that is substantially the same as or similar to that of the opposite electrode 230 (see FIG. 3C). That is, edges 221E, 223E, and 250E of the common layers 221 and 223 and the capping layer 250 may each have an uneven pattern, for example, when seen in a direction perpendicular to a surface of the substrate 100.

The opposite electrode 230 of FIG. 3A, the common layers 221 and 223 of FIG. 3B, and/or the capping layer 250 of FIG. 3C may be formed by using a mask having an opening OP corresponding to the display area DA, and the mask will be described with reference to FIGS. 4A through 4F.

Figure 4A:
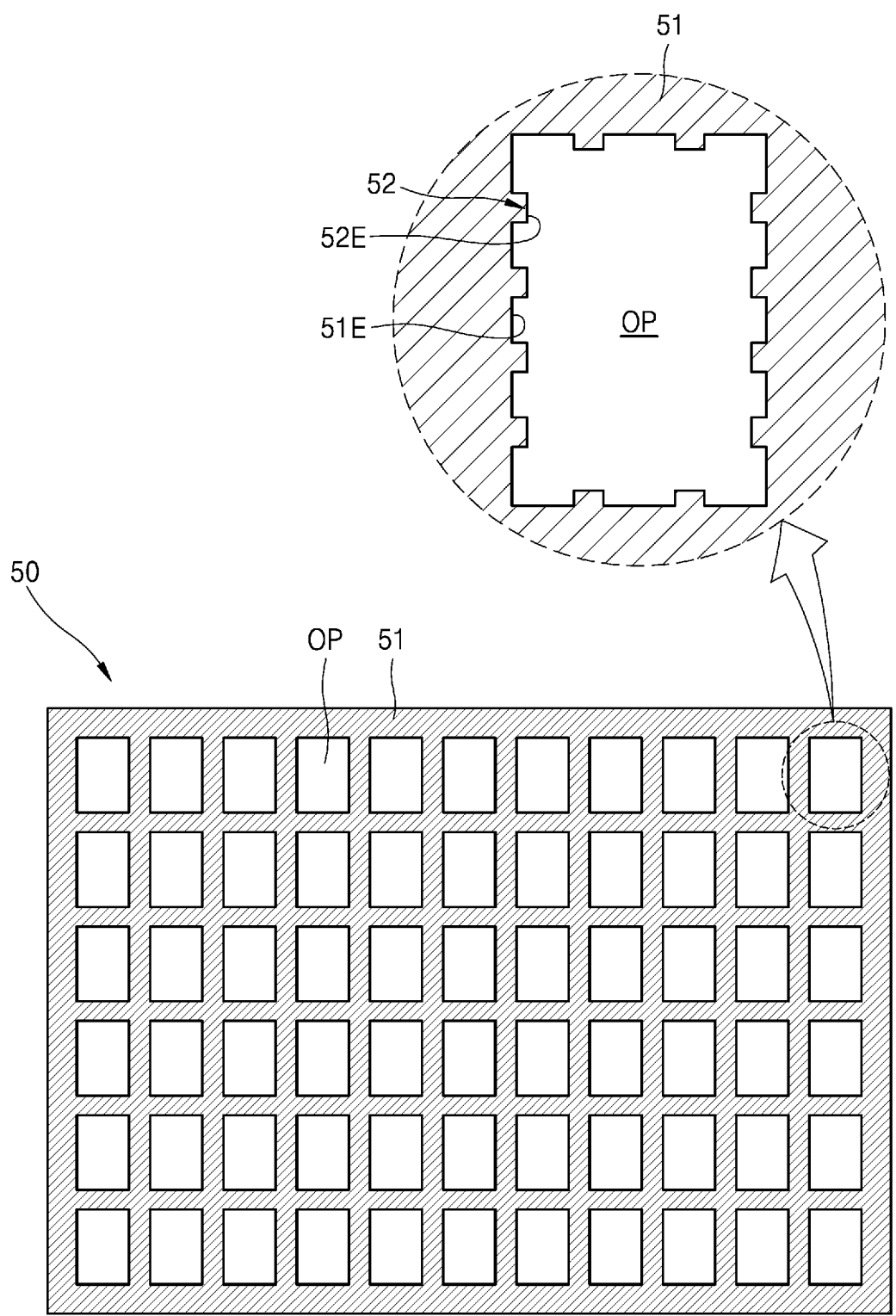
FIG. 4A is a plan view illustrating a mask for manufacturing a display panel and a portion of the mask according to some example embodiments.

FIG. 4A is a plan view illustrating a mask for manufacturing a display panel and a portion of the mask according to some example embodiments. FIGS. 4B through 4F are plan views illustrating a portion of a mask for manufacturing a display panel according to other embodiments.

Referring to FIG. 4A, a mask 50 for manufacturing the display panel 1 (see FIG. 3A) according to some example embodiments may include a body portion 51 and a plurality of opening portions OP surrounded by the body portion 51. The mask 50 may have a flat shape. The mask 50 may have the plurality of opening portions OP formed in a mask sheet that is a metal sheet. One opening portion OP may correspond to one display panel 1.

The mask 50 may be used in a thin-film deposition process for depositing and patterning the same material on most of the area of the substrate 100 (see FIG. 3A). In the thin-film deposition process, a deposition material may pass through the opening portion OP of the mask 50 and may be deposited on a substrate located adjacent to the mask 50. In contrast, the deposition material may be blocked without passing through the body portion 51. Accordingly, a certain layer including an edge having substantially the same shape as that of an edge of the opening portion OP of the mask 50 may be deposited on the substrate.

The mask 50 may include a protruding portion 52 protruding from the body portion 51 toward the center of the opening portion OP. The protruding portion 52 may be located along an inner surface of the body portion 51 that defines the opening portion OP, and an edge 51E of the inner surface of the body portion 51 and an edge 52E of the protruding portion 52 finally define an edge of the opening OP in a plan view.

The edge 52E of the protruding portion 52 may correspond to the concave edge 230E1 (see FIG. 3A) of the opposite electrode 230 (see FIG. 3A), and the edge 51E of the inner surface of the body portion 51 may correspond to the convex edge 230E2 (see FIG. 3A) of the opposite electrode 230. Accordingly, the opposite electrode 230 of the display panel 1 according to some example embodiments may be formed by using the mask 50.

Also, the edge 52E of the protruding portion 52 may correspond to concave edges 221E and 223E1 (see FIG. 3B) of the common layers 221 and 223 (see FIG. 3B) and a concave edge 250E1 (see FIG. 3C) of the capping layer 250 (see FIG. 3C) and the edge 51E of the inner surface of the body portion 51 may correspond to convex edges 221E2 and 223E2 (see FIG. 3B) of the common layers 221 and 223 and a convex edge 250E2 (see FIG. 3C) of the capping layer 250. Accordingly, the common layers 221 and 223 and the capping layer 250 of the display panel 1 according to some example embodiments may be formed by using the mask 50.

Figure 4B:
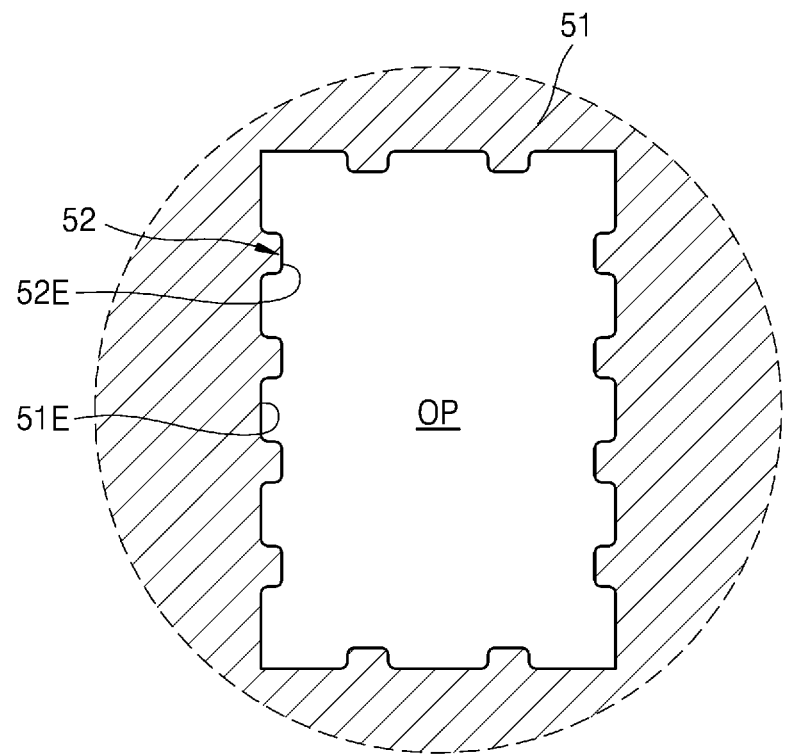
FIGS. 4B through 4F are plan views illustrating a portion of a mask for manufacturing a display panel according to some example embodiments.
Figure 4C:
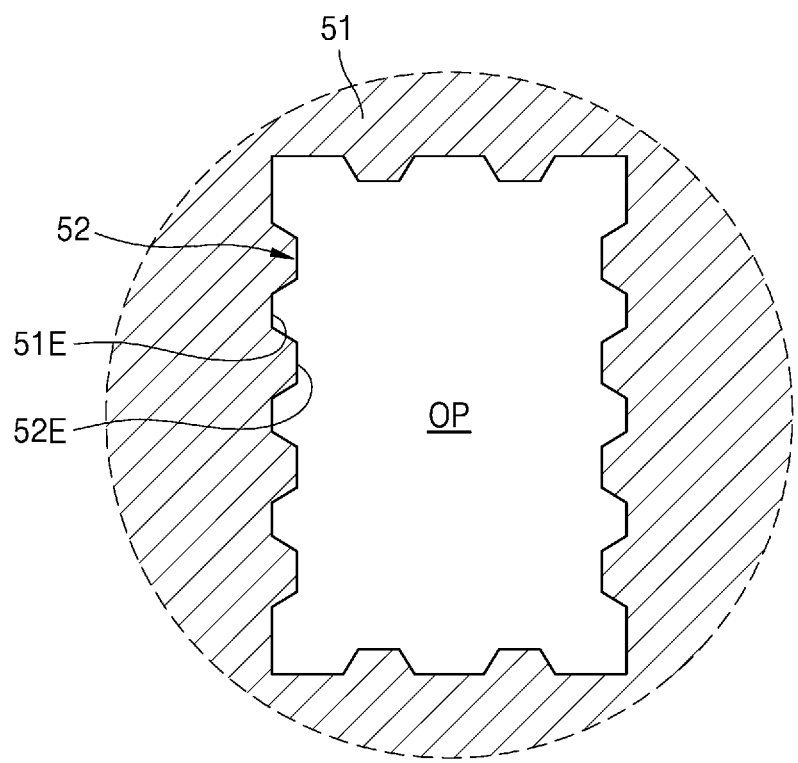
Figure 4D:
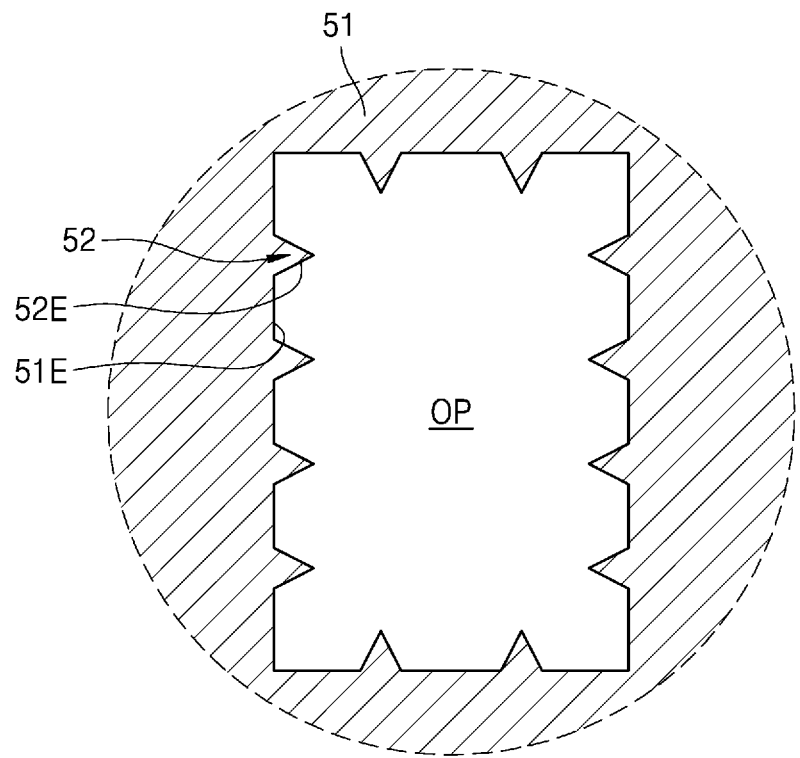
Figure 4E:
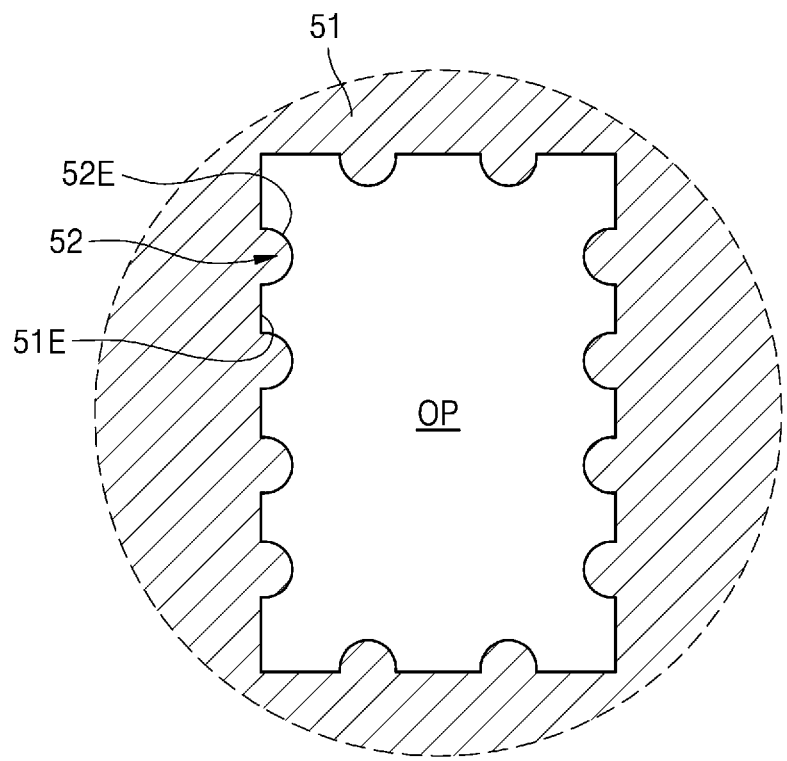

Referring to FIGS. 4A through 4E, the edge 52E of the protruding portion 52 of the mask 50 may have a quadrangular shape, a trapezoidal shape, a triangular shape, or a shape like a part of a circle or a part of an ellipse in a plan view. For example, as shown in FIG. 4B, the edge 52E of the protruding portion 52 may have a quadrangular shape having round corners.

Accordingly, the display panel 1 including the opposite electrode 230, the common layers 221 and 223, and the capping layer 250 each including a concave edge having a quadrangular shape, a trapezoidal shape, a triangular shape, or a shape like a part of a circle or a part of an ellipse in a plan view may be manufactured.

Figure 4F:
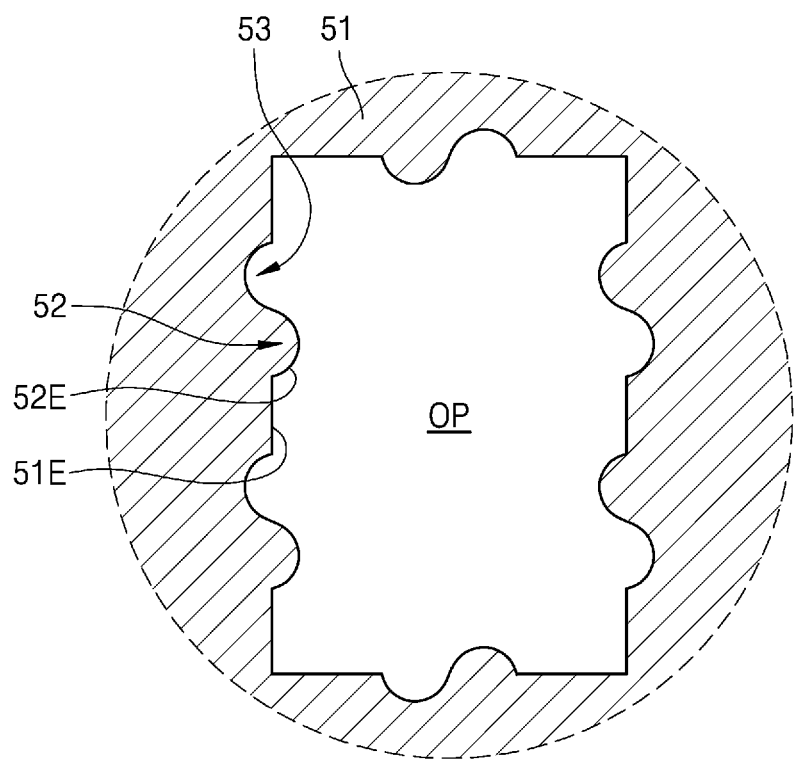

Referring to FIG. 4F, the mask 50 may further include a separate concave portion 53. The concave portion 53 may define a part of the opening portion OP, and may be a portion in which an inner surface of the mask 50 is recessed from the center of the opening portion OP toward the outside.

As described with reference to FIGS. 4A through 4F, an edge of the opening portion OP of the mask 50 may have any of various shapes in a plan view, and thus, the opposite electrode 230, the common layers 221 and 223, and the capping layer 250 having any of various shapes in a plan view may be formed.

Figure 5:
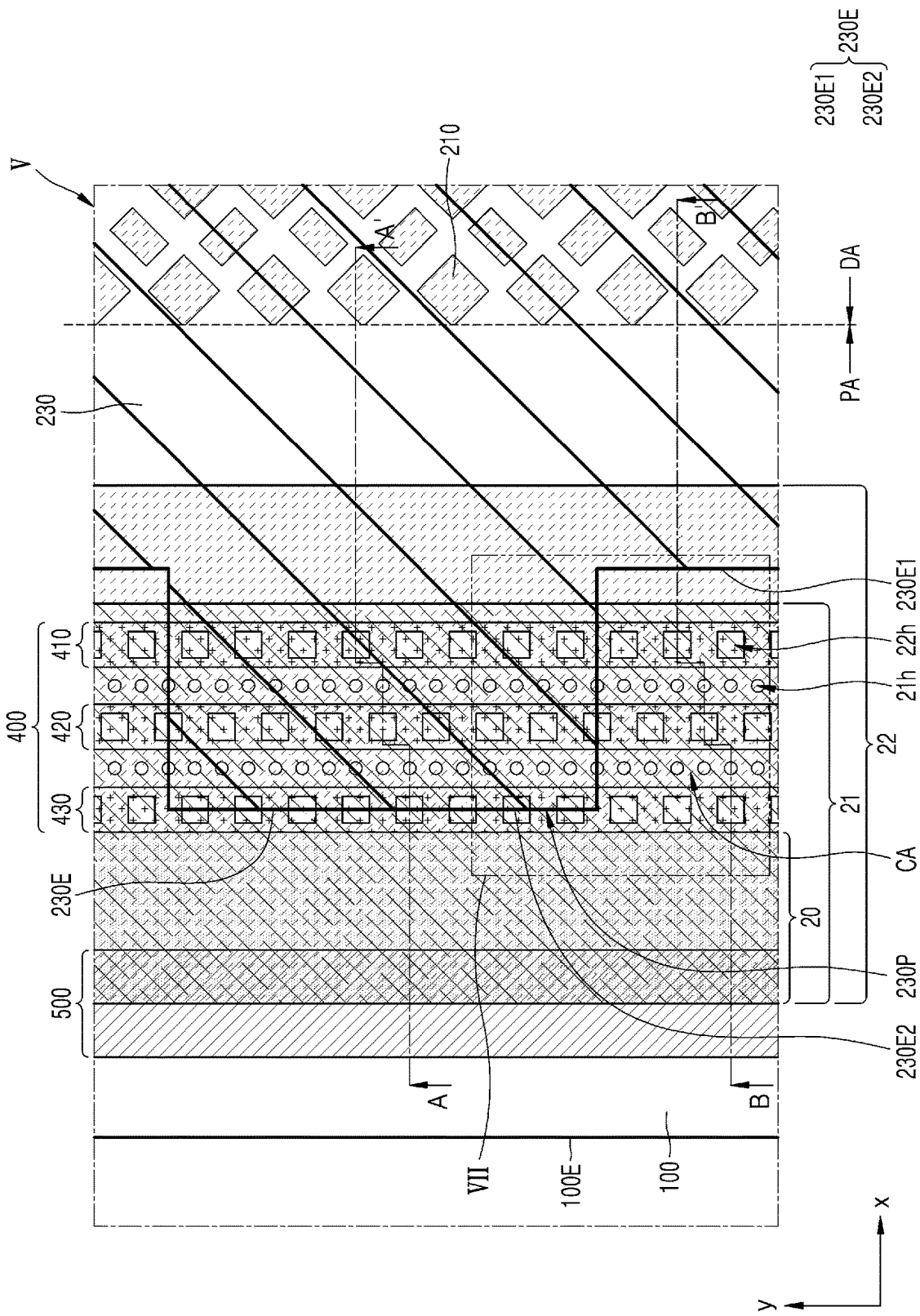
FIG. 5 is a plan view illustrating a portion V of the display panel of FIG. 3A.

FIG. 5 is a plan view illustrating a portion V of the display panel of FIG. 3A.

Referring to FIG. 5, the plurality of pixel electrodes 210 may be located in the display area DA. The plurality of pixel electrodes 210 may be spaced apart from one another. Although the plurality of pixel electrodes 210 are arranged in a pentile type in FIG. 5, the present disclosure is not limited thereto. The plurality of pixel electrodes 210 may be arranged in, for example, a real stripe type, an s-stripe type, or a diamond type. According to some example embodiments, the plurality of emission layers 222 (see FIGS. 6A and 6B) may be located to overlap the plurality of pixel electrodes 210.

The opposite electrode 230 may be located on the plurality of pixel electrodes 210 and the plurality of emission layers 222. The opposite electrode 230 may overlap the display area DA, and may extend from the display area DA to the peripheral area PA. The edge 230E of the opposite electrode 230 may be located in the peripheral area PA. The edge 230E of the opposite electrode 230 may include an uneven portion, when seen in a direction perpendicular to a surface of the substrate 100. That is, the edge 230E of the opposite electrode 230 may include the concave edge 230E1 recessed from the peripheral area PA toward the display area DA and the convex edge 230E2 protruding from the display area DA toward the peripheral area PA in a plan view.

The barrier 400 may be located in the peripheral area PA, and may include one or more barriers. For example, the barrier 400 may include a first barrier 410, a second barrier 420, and a third barrier 430 that are spaced apart from one another and are arranged in a direction from the display area DA toward the peripheral area PA.

A portion of a barrier from among the first through third barriers 410, 420, and 430 may overlap the opposite electrode 230, and another portion of the barrier may not overlap the opposite electrode 230. For example, a portion of the first barrier 410 may overlap the convex portion 230P of the opposite electrode 230. Another portion of the first barrier 410 may be located in the concave area CA, and thus the other portion of the first barrier 410 may not overlap the opposite electrode 230. That is, the concave edge 230E1 of the opposite electrode 230 may be located farther from an edge 100E of the substrate 100 than the first barrier 410.

Likewise, a portion of the second barrier 420 may overlap the convex portion 230P of the opposite electrode 230, and another portion of the second barrier 420 may not overlap the opposite electrode 230. Also, a portion of the third barrier 430 may overlap the convex portion 230P of the opposite electrode 230, and another portion of the third barrier 430 may not overlap the opposite electrode 230. That is, the concave edge 230E1 of the opposite electrode 230 may be located farther from the edge 100E of the substrate 100 than each of the second barrier 420 and the third barrier 430.

The common power supply line 20, a first conductive layer 21, and a second conductive layer 22 may be located in the peripheral area PA. The common power supply line 20 may be electrically connected to the opposite electrode 230 through the first conductive layer 21 and the second conductive layer 22.

The opposite electrode 230 may be electrically connected to the second conductive layer 22, while overlapping a part of the second conductive layer 22. Another part of the second conductive layer 22 may overlap the first conductive layer 21, and may be electrically connected to the first conductive layer 21. A part of the first conductive layer 21 may be electrically connected to the common power supply line 20, while overlapping the common power supply line 20. In this structure, the opposite electrode 230 may be electrically connected to the common power supply line 20 through the second conductive layer 22 and the first conductive layer 21, and may receive the common power supply voltage ELVSS supplied from the common power supply line 20. The second conductive layer 22 may have a width greater than that of the first conductive layer 21, and the first conductive layer 21 may have a width greater than that of the common power supply line 20.

The first conductive layer 21 may have a plurality of first holes 21h, and the second conductive layer 22 may have a plurality of second holes 22h. The plurality of first holes 21h may function as a path through which gas contained in an organic insulating layer located under the first conductive layer 21 may be discharged. Likewise, the plurality of second holes 22h may function as a path through which gas contained in an organic insulating layer located under the second conductive layer 22 may be discharged. Although the plurality of first holes 21h have circular shapes and the plurality of second holes 22h have quadrangular shapes in FIG. 5, the present disclosure is not limited thereto. Sizes and shapes of the plurality of first holes 21h and the plurality of second holes 22h may be modified in various ways.

Each of the first through third barriers 410, 420, and 430 may overlap the plurality of second holes 22h. For example, as shown in FIG. 5, the plurality of second holes 22h may be arranged in three columns in an extending direction of the edge 100E of the substrate 100, and each column of second holes 22h may be covered by one barrier.

For example, the plurality of first holes 21h may be located between the plurality of second holes 22h. The plurality of first holes 21h may be arranged in columns between a plurality of columns of second holes 22h. In FIG. 5, the plurality of first holes 21h are arranged in two columns.

The opposite electrode 230 may overlap parts of the plurality of first holes 21h and parts of the plurality of second holes 22h, and the opposite electrode 230 may not overlap other parts of the plurality of first holes 21h and other parts of the plurality of second holes 22h. In detail, the convex portion 230P of the opposite electrode 230 may overlap parts of the plurality of first holes 21h and parts of the plurality of second holes 22h. The opposite electrode 230 may not overlap other parts of the plurality of first holes 21h and other parts of the plurality of second holes 22h, and the other parts of the plurality of first holes 21h and the other parts of the plurality of second holes 22h may be located in the concave area CA.

The partition wall 500 may be closer to the edge 100E of the substrate 100 than the opposite electrode 230 and the plurality of pixel electrodes 210. The partition wall 500 may surround the display area DA in a plan view. The partition wall 500 may overlap a part of each of the common power supply line 20, the first conductive layer 21, and the second conductive layer 22.

Figure 6A:
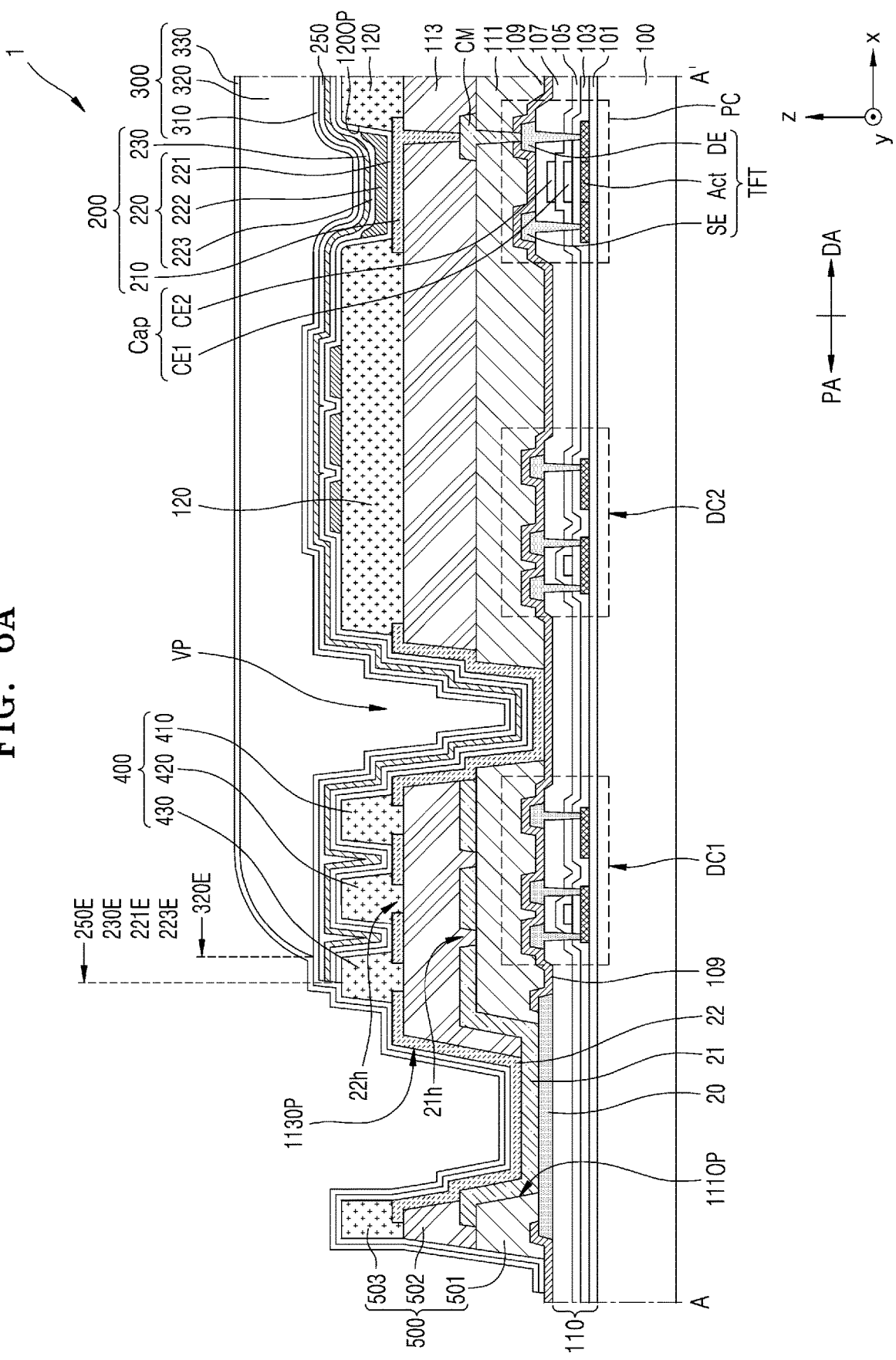
FIGS. 6A and 6B are cross-sectional views respectively taken along the line A-A' and the line B-B' of the display panel of FIG. 5.
Figure 6B:
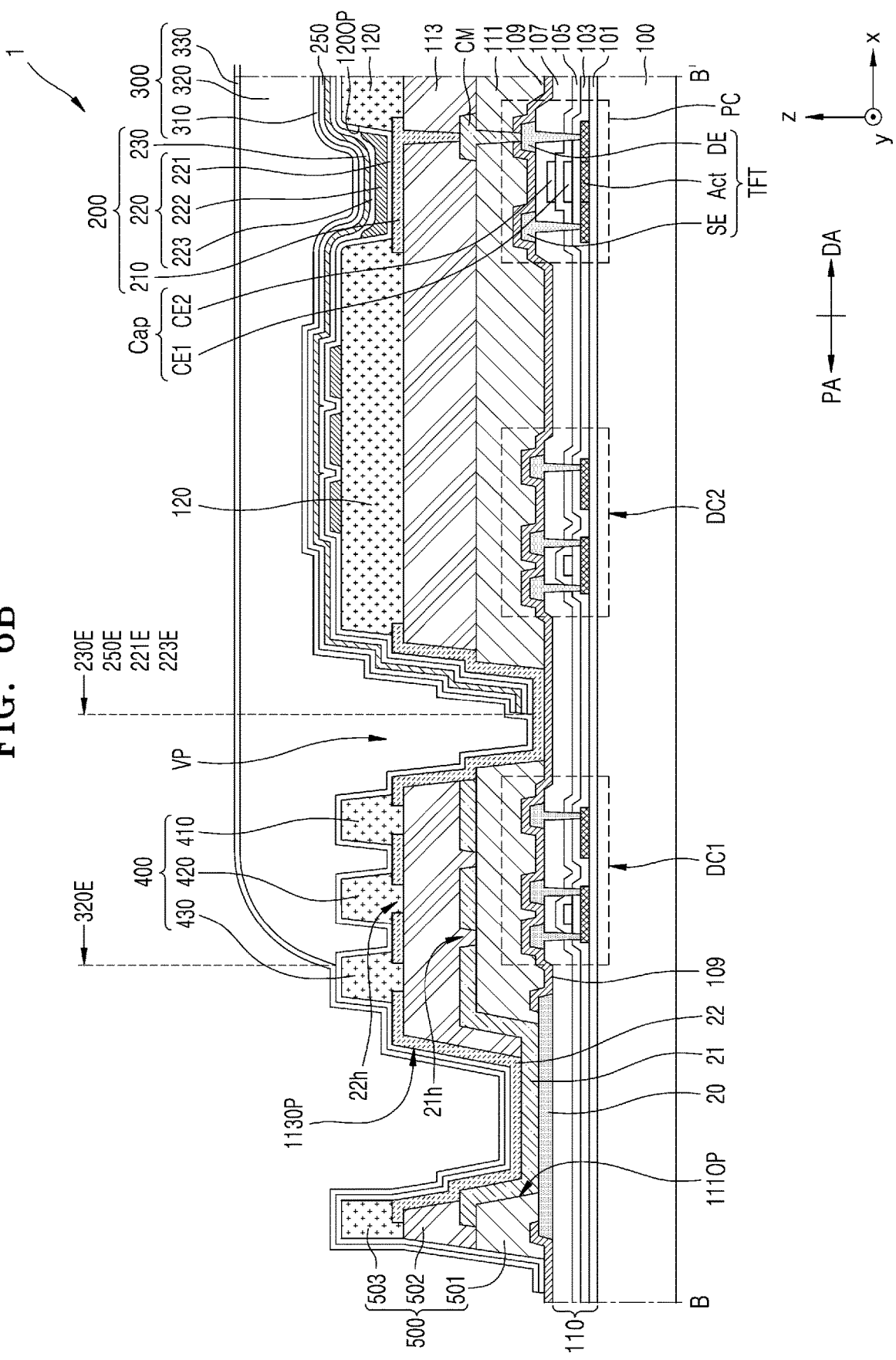

FIGS. 6A and 6B are cross-sectional views respectively taken along the line A-A' and the line B-B' of the display panel of FIG. 5. The line A-A' passes through a convex portion of an opposite electrode, and the line B-B' passes through a concave area.

Referring to the display area DA of FIG. 6A, the display panel 1 may include the substrate 100. The substrate 100 may include glass, a metal, or a polymer resin. When the substrate 100 is flexible or bendable, the substrate 100 may include a polymer resin such as polyethersulfone, polyacrylate, polyetherimide, polyethylene naphthalate, polyethylene terephthalate, polyphenylene sulfide, polyarylate, polyimide, polycarbonate, or cellulose acetate propionate. For example, the substrate 100 may have a multi-layer structure including two layers each including a polymer resin and a barrier layer including an inorganic material located between the two layers. For example, the barrier layer may include an inorganic material such as silicon oxide, silicon nitride, or silicon oxynitride.

A buffer layer 101 may be formed on the substrate 100. The buffer layer 101 may prevent or reduce instances of a foreign material, moisture, or other contaminants penetrating through the substrate 100. For example, the buffer layer 101 may include an inorganic material such as silicon oxide (SiOx), silicon nitride (SiNx), and/or silicon oxynitride (SiON), and may have a single or multi-layer structure.

Thin-film transistors TFTs and the storage capacitor Cap corresponding to the display area DA, and the organic light-emitting diode OLED that is a light-emitting element 200 electrically connected to the thin-film transistors TFTs and the storage capacitor Cap may be located on the substrate 100.

Each of the thin-film transistor TFT may include a semiconductor layer Act, a gate electrode GE overlapping a channel region of the semiconductor layer Act, and a source electrode SE and a drain electrode DE respectively connected to a source region and a drain region of the semiconductor layer Act.

The semiconductor layer Act may include polysilicon. According to some example embodiments, the semiconductor layer Act may include amorphous silicon. According to some example embodiments, the semiconductor layer Act may include an oxide of at least one material selected from the group consisting of indium (In), gallium (Ga), stannum (Sn), zirconium (Zr), vanadium (V), hafnium (Hf), cadmium (Cd), germanium (Ge), chromium (Cr), titanium (Ti), and zinc (Zn). The semiconductor layer Act may include the channel region, and the source region and the drain region doped with impurities.

The gate electrode GE may include a low-resistance conductive material such as molybdenum (Mo), aluminum (Al), copper (Cu), and/or titanium (Ti), and may have a single or multi-layer structure including the above material.

The source electrode SE or the drain electrode DE may include aluminum (Al), platinum (Pt), palladium (Pd), silver (Ag), magnesium (Mg), gold (Au), nickel (Nl), neodymium (Nd), iridium (Ir), chromium (Cr), calcium (Ca), molybdenum (Mo), titanium (Ti), tungsten (W), and/or copper (Cu), and may have a single or multi-layer structure including the above material. For example, the source electrode SE or the drain electrode DE may have a three-layer structure including a titanium layer, an aluminum layer, and a titanium layer. The source electrode SE or the drain electrode DE may be located on the same layer.

In order to ensure or improve insulation between the semiconductor layer Act and the gate electrode GE, the gate insulating layer 103 may be located between the semiconductor layer Act and the gate electrode GE. The gate insulating layer 103 may include an inorganic insulating material such as silicon oxide, silicon nitride, silicon oxynitride, aluminum oxide, titanium oxide, tantalum oxide, or hafnium oxide. The gate insulating layer 103 may have a single or multi-layer structure including the above material.

The storage capacitor Cap may include the lower electrode CE1 and the upper electrode CE2 overlapping each other with a first interlayer insulating layer 105 therebetween. According to some example embodiments, the storage capacitor Cap may overlap the thin-film transistor TFT, and the gate electrode GE of the thin-film transistor TFT may function as the lower electrode CE1 of the storage capacitor Cap. According to some example embodiments, the storage capacitor Cap may not overlap the thin-film transistor TFT. The storage capacitor Cap may be covered by a second interlayer insulating layer 107. The upper electrode CE2 of the storage capacitor Cap may include a conductive material including molybdenum (Mo), aluminum (Al), copper (Cu), or titanium (Ti), and may have a single or multi-layer structure including the above material.

The first interlayer insulating layer 105 and the second interlayer insulating layer 107 may be located on the gate insulating layer 103, and may include an inorganic insulating material such as silicon oxide, silicon nitride, or silicon oxynitride. The first interlayer insulating layer 105 and the second interlayer insulating layer 107 may have a single or multi-layer structure including the above material.

A first organic insulating layer 111 may be located on the second interlayer insulating layer 107. The first organic insulating layer 111 may include an organic insulating material, and examples of the organic insulating material may include an imide-based polymer, a general-purpose polymer (e.g., polymethyl methacrylate (PMMA) or polystyrene (PS)), a polymer derivative having a phenol-based group, an acrylic polymer, an aryl ether-based polymer, an amide-based polymer, a fluorinated polymer, a p-xylene-based polymer, a vinyl alcohol-based polymer, and a blend thereof. According to some example embodiments, the first organic insulating layer 111 may include polyimide.

A second organic insulating layer 113 may be located on the first organic insulating layer 111. The second organic insulating layer 113 may include an imide-based polymer, a general-purpose polymer (e.g., polymethyl methacrylate (PMMA) or polystyrene (PS)), a polymer derivative having a phenol-based group, an acrylic polymer, an aryl ether-based polymer, an amide-based polymer, a fluorinated polymer, a p-xylene-based polymer, a vinyl alcohol-based polymer, or a blend thereof. According to some example embodiments, the second organic insulating layer 113 may include polyimide.

The pixel electrode 210 may be located on the second organic insulating layer 113. The pixel electrode 210 may include a transparent conductive layer formed of a transparent conductive oxide such as indium tin oxide (ITO), $In_2O_3$, or indium zinc oxide (IZO), and a reflective layer formed of a metal such as aluminum (Al) or silver (Ag). For example, the pixel electrode 210 may have a three-layer structure including ITO/Ag/ITO. The pixel electrode 210 may contact a contact metal CM through a contact hole formed in the second organic insulating layer 113, and the contact metal CM may contact one of the source electrode SE and the drain electrode DE through a contact hole formed in the first organic insulating layer 111 and may be electrically connected to the thin-film transistor TFT. That is, the pixel electrode 210 may be electrically connected to the thin-film transistor TFT through the contact metal CM.

A pixel-defining layer 120 may be located on the pixel electrode 210, and the pixel-defining layer 120 may have an opening corresponding to each pixel, that is, an opening 120OP through which at least a central portion of the pixel electrode 210 is exposed, thereby defining a light-emitting area of the pixel. Also, the pixel-defining layer 120 may increase a distance between an edge of the pixel electrode 210 and the opposite electrode 230, thereby preventing or reducing instances of an arc or the like occurring between the edge of the pixel electrode 210 and the opposite electrode 230. The pixel-defining layer 120 may be formed of an organic material such as polyimide or hexamethyldisiloxane (HMDSO).

An intermediate layer 220 may be located on the pixel-defining layer 120. The intermediate layer 220 may be located between the pixel electrode 210 and the opposite electrode 230.

The intermediate layer 220 may include the emission layer 222 formed to correspond to the pixel electrode 210. The emission layer 222 may include an organic light-emitting material such as a high or low molecular weight organic material that emits light of a certain color. Alternatively, the emission layer 222 may include an inorganic light-emitting material, or may include quantum dots.

A first functional layer 221 and a second functional layer 223 may be respectively located under and over the emission layer 222. The first functional layer 221 may have a single or multi-layer structure. For example, the first functional layer 221 that is a hole transport layer (HTL) having a single-layer structure may include poly(3,4-ethylenedioxythiophene) (PEDOT) or polyaniline (PANI). Alternatively, the first functional layer 221 may include a hole injection layer (HIL) and a hole transport layer (HTL). The second functional layer 223 may have a single or multi-layer structure. The second functional layer 223 may include an electron transport layer (ETL) and/or an electron injection layer (EIL).

The emission layer 222 of the intermediate layer 220 may be located for each pixel, whereas the first functional layer 221 and the second functional layer 223 may be integrally formed to cover a plurality of pixels. That is, the first functional layer 221 and the second functional layer 223 may be common layers. The first functional layer 221 and the second functional layer 223 may extend from the display area DA to the peripheral area PA.

The opposite electrode 230 may be located on the intermediate layer 220, to cover the display area DA. That is, the opposite electrode 230 may be integrally formed to cover a plurality of pixels. The opposite electrode 230 may extend from the display area DA to the peripheral area PA. The opposite electrode 230 may be formed of a conductive material having a low work function. For example, the opposite electrode 230 may include a (semi-)transparent layer including silver (Ag), magnesium (Mg), aluminum (Al) platinum (Pt), palladium (Pd), gold (Au), nickel (Ni), neodymium (Nd), iridium (Ir), chromium (Cr), lithium (Li), calcium (Ca), or an alloy thereof. Alternatively, the opposite electrode 230 may further include a layer formed of ITO, IZO, ZnO, or $In_2O_3$ on the (semi-)transparent layer including the above material.

A stacked structure of the pixel electrode 210, the intermediate layer 220, and the opposite electrode 230 may constitute the organic light-emitting diode OLED as the light-emitting element 200. The organic light-emitting diode OLED may emit red light, green light, or blue light. The opening 120OP of the pixel-defining layer 120 may define a size and/or a width of the light-emitting area.

The capping layer 250 may be formed on the opposite electrode 230. The capping layer 250 may include an organic insulating material and/or an inorganic insulating material such as silicon nitride. According to some example embodiments, the capping layer 250 may be omitted. The capping layer 250 may cover the display area DA, and may extend from the display area DA to the peripheral area PA.

A thin-film encapsulation layer 300 may cover the light-emitting element 200, and may prevent or reduce damage due to external moisture, oxygen, or other contaminants. The thin-film encapsulation layer 300 may cover the display area DA, and may extend from the display area DA to the peripheral area PA. The thin-film encapsulation layer 300 may include at least one inorganic encapsulation layer and at least one organic encapsulation layer. In FIG. 6A, the thin-film encapsulation layer 300 includes a first inorganic encapsulation layer 310, an organic encapsulation layer 320, and a second inorganic encapsulation layer 330.

The first inorganic encapsulation layer 310 may cover the opposite electrode 230, and may include silicon oxide, silicon nitride, and/or silicon oxynitride. Because the first inorganic encapsulation layer 310 is formed along a lower structure, a top surface of the first inorganic encapsulation layer 310 is not flat. The organic encapsulation layer 320 may cover the first inorganic encapsulation layer 3140, and a top surface of the organic encapsulation layer 320 may be substantially flat, unlike the first inorganic encapsulation layer 310. In detail, a portion of the organic encapsulation layer 320 corresponding to the display area DA may be substantially flat. The organic encapsulation layer 320 may include a polymer-based material. Examples of the polymer-based material may include an acrylic resin, an epoxy resin, polyimide, and/or polyethylene. Examples of the acrylic resin may include polymethyl methacrylate and polyacrylic acid. The organic encapsulation layer 320 may be transparent. The second inorganic encapsulation layer 330 may cover the organic encapsulation layer 320, and may include silicon oxide, silicon nitride, and/or silicon oxynitride.

The first and second inorganic encapsulation layers 310 and 330 may be formed by using chemical vapor deposition (CVD), and the organic encapsulation layer 320 may be formed by applying a liquid organic material to the substrate 100 and curing the liquid organic material.

Referring to the peripheral area PA of FIG. 6A, an inorganic insulating layer 110 may be located on the substrate 100, and the inorganic insulating layer 110 may include the buffer layer 101, the gate insulating layer 103, and the first and second interlayer insulating layers 105 and 107. The common power supply line 20 may be located on the inorganic insulating layer 110. The common power supply line 20 may include the same material as that of the source electrode SE and/or the drain electrode DE.

A part of a top surface of the common power supply line 20 may be exposed through a first opening 111OP of the first organic insulating layer 111 located on the common power supply line 20. The top surface of the common power supply line 20 exposed through the first opening 111OP may directly contact the first conductive layer 21 located on the first organic insulating layer 111. The first conductive layer 21 may directly contact the common power supply line 20 through the first opening 111OP of the first organic insulating layer 111.

An edge or a side surface of the common power supply line 20 may be covered by a protective layer 109. The protective layer 109 may prevent or reduce instances of the common power supply line 20 including a metal such as aluminum that may be damaged by an etchant in a manufacturing process of the display panel 1 being exposed to an etching environment. In the peripheral area PA other than the area of FIG. 6A, the common power supply line 20 may be exposed without being covered by the first organic insulating layer 111, and the exposed common power supply line 20 may be damaged beginning from the side surface by an etchant used in a process after the common power supply line 20 is formed. In order to prevent or reduce the problem, the protective layer 109 may cover and protect the side surface of the common power supply line 20.

The protective layer 109 may cover the thin-film transistor TFT in the display area DA. The protective layer 109 may include, for example, silicon nitride (SiNx). Hydrogen contained in the silicon nitride may be combined with a dangling bond of the semiconductor layer of the thin-film transistor to remove a defect site in the semiconductor layer, thereby improving characteristics of the thin-film transistor.

The first conductive layer 21 may be located on the first organic insulating layer 111, to directly contact the top surface of the common power supply line 20 through the first opening 111OP. The first conductive layer 21 may include a conductive material including silver (Ag), magnesium (Mg), aluminum (Al) platinum (Pt), palladium (Pd), gold (Au), nickel (Ni), neodymium (Nd), iridium (Ir), chromium (Cr), lithium (Li), calcium (Ca), or an alloy thereof.

The first conductive layer 21 may have the plurality of first holes 21h. For example, a portion of the first conductive layer 21 overlapping the first organic insulating layer 111 may have the plurality of first holes 21h, and a portion of the first conductive layer 21 directly contacting the common power supply line 20 may not have the first holes 21h to increase a contact area. The first conductive layer 21 may be covered by the second organic insulating layer 113, and a part of a top surface of the first conductive layer 21 may be exposed through a second opening 113OP of the second organic insulating layer 113. The exposed top surface of the first conductive layer 21 may contact the second conductive layer 22, and may be electrically connected to the second conductive layer 22.

The second conductive layer 22 may be located on the second organic insulating layer 113, and may directly contact the top surface of the first conductive layer 21 through the second opening 113OP. The second conductive layer 22 may be formed of the same material as that of the pixel electrode 210. For example, the second conductive layer 22 may have a three-layer structure including ITO/Ag/ITO.

The second conductive layer 22 may have the plurality of second holes 22h. For example, a portion of the second conductive layer 22 overlapping the second organic insulating layer 113 may have the plurality of second holes 22h, and a portion of the second conductive layer 22 directly contacting the first conductive layer 21 may not have the second holes 22h to increase a contact area.

The plurality of first holes 21h of the first conductive layer 21 and the plurality of second holes 22h of the second conductive layer 22 may function as paths through which materials contained in insulating layers (i.e., the first organic insulating layer 111 and the second organic insulating layer 113) respectively under the first conductive layer 21 and the second conductive layer 22 are vaporized and discharged. A thermal process (e.g., a curing process) is performed after the pixel-defining layer 120 is formed on the pixel electrode 210, and due to heat applied during the thermal process, a part of a material contained in the second organic insulating layer 113 or the first organic insulating layer 111 under the second conductive layer 22 may be vaporized and may be discharged to the outside through the first holes 21h and/or the second holes 22h. Accordingly, the problem that when there are no first holes 21h and no second holes 22h, gas generated from an organic insulating layer moves toward the light-emitting element 200 and affects the light-emitting element 200 of some pixels located on an edge of the display area DA, and light is not emitted from the light-emitting element 200 may be prevented or reduced.

An edge of the second conductive layer 22 may be covered by the pixel-defining layer 120 or an insulating layer including the same material as that of the pixel-defining layer 120. Also, the plurality of second holes 22h of the second conductive layer 22 and edges of the second holes 22h respectively surrounding the plurality of second holes 22h may be covered by the first through third barriers 410, 420, and 430. The first through third barriers 410, 420, and 430 may include the same material as that of the pixel-defining layer 120, and may be formed in the same mask process. The pixel-defining layer 120 and the first through third barriers 410, 420, and 430 may each include an insulating material.

Because the edge of the second conductive layer 22 and the edge surrounding the second hole 22h are each covered by the insulating material, instances of a part of a material, for example, silver (Ag), used to form the second conductive layer 22 receives electrons in a manufacturing process of the display panel and is precipitated as silver may be prevented or reduced. Accordingly, the problem that when the edge of the second conductive layer 22 and the edge surrounding the second hole 22h are exposed, silver (Ag) may be precipitated in a manufacturing process and the precipitated silver causes dark spots may be prevented or reduced.

The first through third barriers 410, 420, and 430 may be spaced apart from one another. The first through third barriers 410, 420, and 430 may respectively overlap the plurality of second holes 22h. For example, the first through third barriers 410, 420, and 430 may be spaced apart from one another in an x-direction as shown in FIGS. 5 and 6A, and may extend in a y-direction to overlap the plurality of second holes 22h arranged in the y-direction.

The barrier 400 may control the flow of the organic encapsulation layer 320 of the thin-film encapsulation layer 300. When the organic encapsulation layer 320 is formed, an organic material used to form the organic encapsulation layer 320 may flow toward an edge of the substrate 100, for example, in the −x-direction. In this case, because the plurality of barriers 400 that are spaced apart from one another interfere with the flow of the organic material as shown in FIG. 6A, a position of an end portion of the organic material, that is, a position of the edge 320E of the organic encapsulation layer 320, in the display panel may be controlled.

The organic encapsulation layer 320 may cover at least parts of the barriers 400. For example, the edge 320E of the organic encapsulation layer 320 may be located on the third barrier 430 as shown in FIG. 6A. However, this is merely an example, and a position of the edge 320E of the organic encapsulation layer 320 may vary according to a type of the organic material, and the number, an arrangement, an interval, etc. of the barriers 400.

The organic encapsulation layer 320 may be formed so that the organic encapsulation layer 320 has a certain thickness in the display area DA and the peripheral area PA adjacent to the display area DA. An input sensing layer including touch electrodes and an optical functional layer on the input sensing layer may be located on the thin-film encapsulation layer 300. In order to well form the input sensing layer and the optical functional layer on the thin-film encapsulation layer 300, the organic encapsulation layer 320 of the thin-film encapsulation layer 300 has to be formed at a pre-determined position and has to have a uniform sufficient thickness in a certain area. A thickness of the organic encapsulation layer 320 may be affected by a position of an organic material in a process of forming the organic encapsulation layer 320. When a position of the organic material, for example, a position of the edge 320E of the organic encapsulation layer 320, is greatly deviated from the pre-determined position, the organic material of the organic encapsulation layer 320 that is applied by a fixed amount may fail to have a sufficient thickness or a uniform thickness in the certain area. Accordingly, it is required to accurately and precisely control the position of the edge 320E of the organic encapsulation layer 320. To this end, the first through third barriers 410, 420, and 430 may be used to identify the position of the edge 320E of the organic encapsulation layer 320.

Each of the common layers 221 and 223, the opposite electrode 230, and the capping layer 250 may extend from the display area DA to the peripheral area PA as described above, and may cover at least a part of the barrier 400. The edges 221E and 223E of the common layers 221 and 223, the edge 230E of the opposite electrode 230, and the edge 250E of the capping layer 250 may each be located in the peripheral area PA and may overlap one another.

A portion (i.e., convex edge) of each of the edges 221E, 223E, 230E, and 250E may be located on the barrier 400, and may be located closer to the edge of the substrate 100 than the edge 320E of the organic encapsulation layer 320. Although the edges 221E, 223E, 230E, and 250E are located on the third barrier 430 in FIG. 6A, the present disclosure is not limited thereto. Each of the edges 221E, 223E, 230E, and 250E may be located on the first barrier 410 or the second barrier 420, may be located between the barriers 400, or may be located closer to the edge of the substrate 100 than the barrier 400 according to a process error in a manufacturing process of the display panel 1. That is, each of the common layers 221 and 223, the opposite electrode 230, and the capping layer 250 may at least partially overlap one of the barriers 400.

It may be difficult to identify a position of the edge 320E of the organic encapsulation layer 320 by using the barrier 400 according to a position of each of the edges 221E, 223E, 230E, and 250E. The present disclosure may be proposed to solve the difficulty, which will be described with reference to FIGS. 7A and 7B.

The partition wall 500 may be located at a position adjacent to the edge of the substrate 100, outside the barrier 400. The partition wall 1500 may prevent or reduce instances of the organic material being introduced into the edge of the substrate 100 when the organic encapsulation layer 320 is formed, thereby preventing or reducing instances of an edge tail of the organic encapsulation layer 320. For example, the partition wall 500 may partially overlap the common power supply line 20 as shown in FIG. 6A.

The partition wall 500 may include a first layer 501, a second layer 502, and a third layer 503 as shown in FIG. 5. The first layer 501 may include the same material as that of the first organic insulating layer 111, the second layer 502 may include the same material as that of the second organic insulating layer 113, and the third layer 503 may include the same material as that of the pixel-defining layer 120. The partition wall 500 may entirely surround the display area DA in order to prevent or reduce instances of an edge tail of the organic encapsulation layer 320. Accordingly, the partition wall 500 may have a continuous loop shape surrounding the display area DA.

A part of the second conductive layer 22 may contact an inorganic layer. A valley portion VP may pass through organic insulating layers, that is, the first and second organic insulating layers 111 and 113, located under the second conductive layer 22, and a part of the second conductive layer 22 may contact an inorganic insulating layer, for example, the protective layer 109, through the valley portion VP.

Because each of the first and second organic insulating layers 111 and 113 has a disconnected structure due to the valley portion VP, a path through which impurities travel through a bulk of the first and second organic insulating layers 111 and 113 may be disconnected. For example, impurities generated during a manufacturing process of the display panel 1 or impurities penetrated after the manufacturing process may travel toward the display area DA through the bulk of the first and second organic insulating layers 111 and 113 and may degrade the pixel PX of the display area DA. However, according to some example embodiments, because a path through which impurities travel is disconnected due to the valley portion VP, the light-emitting element 200 of the pixel PX may be protected from the impurities.

A first driving circuit DC1 may be located between the common power supply line 20 and the valley portion VP, and a second driving circuit DC2 may be located between the valley portion VP and the pixel circuit PC. Each of the first driving circuit DC1 and the second driving circuit DC2 may be a driver circuit for generating and controlling an electrical signal such as an emission control signal or a scan signal. The first driving circuit DC1 and the second driving circuit DC2 may be formed together in a process of forming the thin-film transistors TFTs, the storage capacitor Cap, and various wirings connected to the thin-film transistors TFTs and the storage capacitor Cap.

Because the inorganic insulating layer 110, the protective layer 109 including an inorganic material, and the first and second inorganic encapsulation layers 310 and 330 of the thin-film encapsulation layer 300 are stacked on an end portion of the substrate 100, instances of moisture or other contaminants permeating from the edge of the substrate 100 may be prevented or reduced.

Referring to FIG. 6B, portions (i.e., concave edges) of each of the edges 221E and 223E of the common layers 221 and 223, the edge 230E of the opposite electrode 230, and the edge 250E of the capping layer 250 may be located on the valley portion VP, and may be located farther from the edge of the substrate 100 than the edge 320E of the organic encapsulation layer 320. Accordingly, the common layers 221 and 223, the opposite electrode 230, and the capping layer 250 may not overlap a part of the barrier 400. At least one inorganic encapsulation layer (e.g., the first inorganic encapsulation layer) of the thin-film encapsulation layer 300 may directly contact the part of the barrier 400. Accordingly, as described below, an area where an organic material of the organic encapsulation layer 320 is formed may be more easily identified through the barrier 400.

Figure 7A:
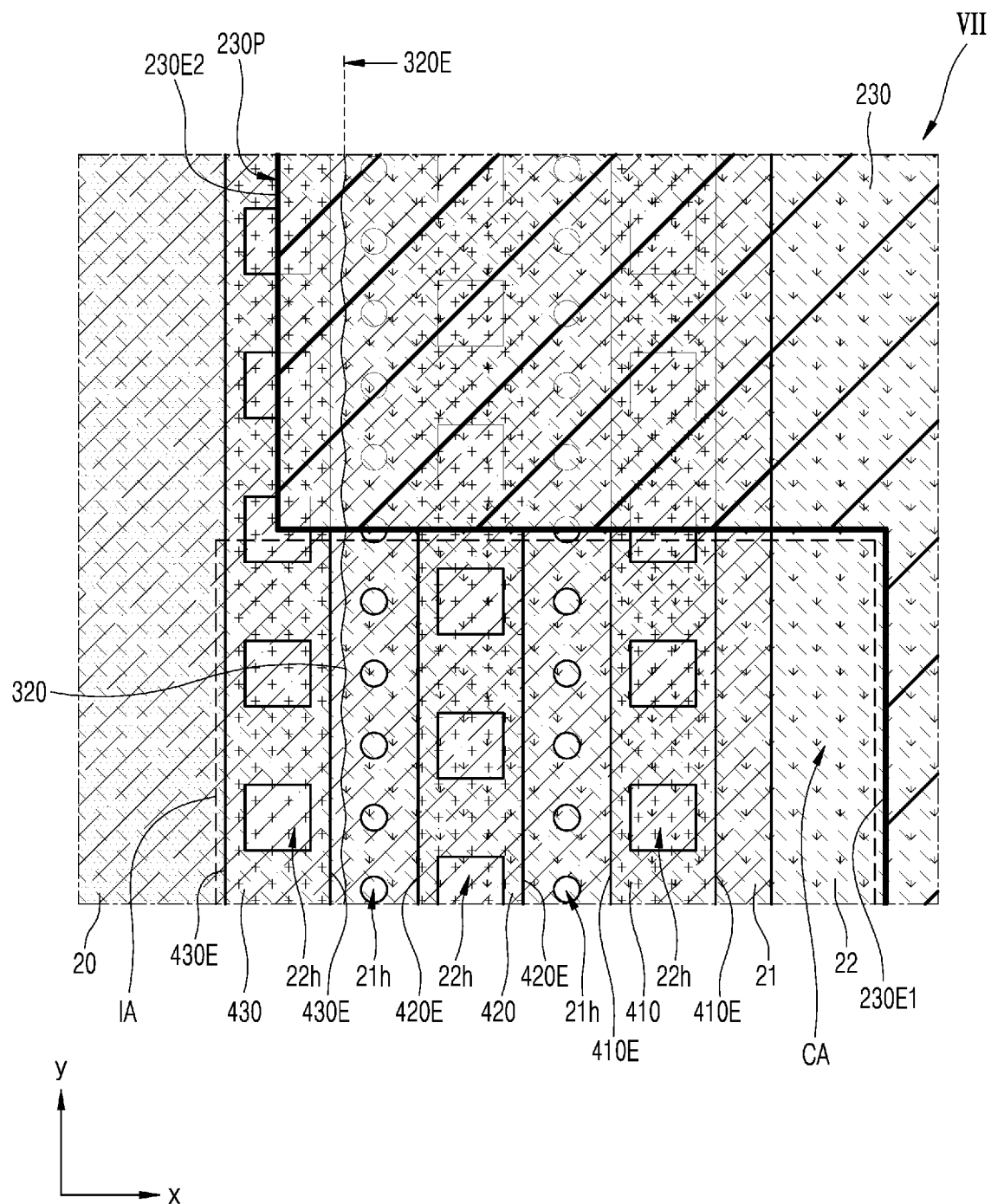
FIG. 7A is a plan view illustrating a part of a display panel according to some example embodiments.
Figure 7B:
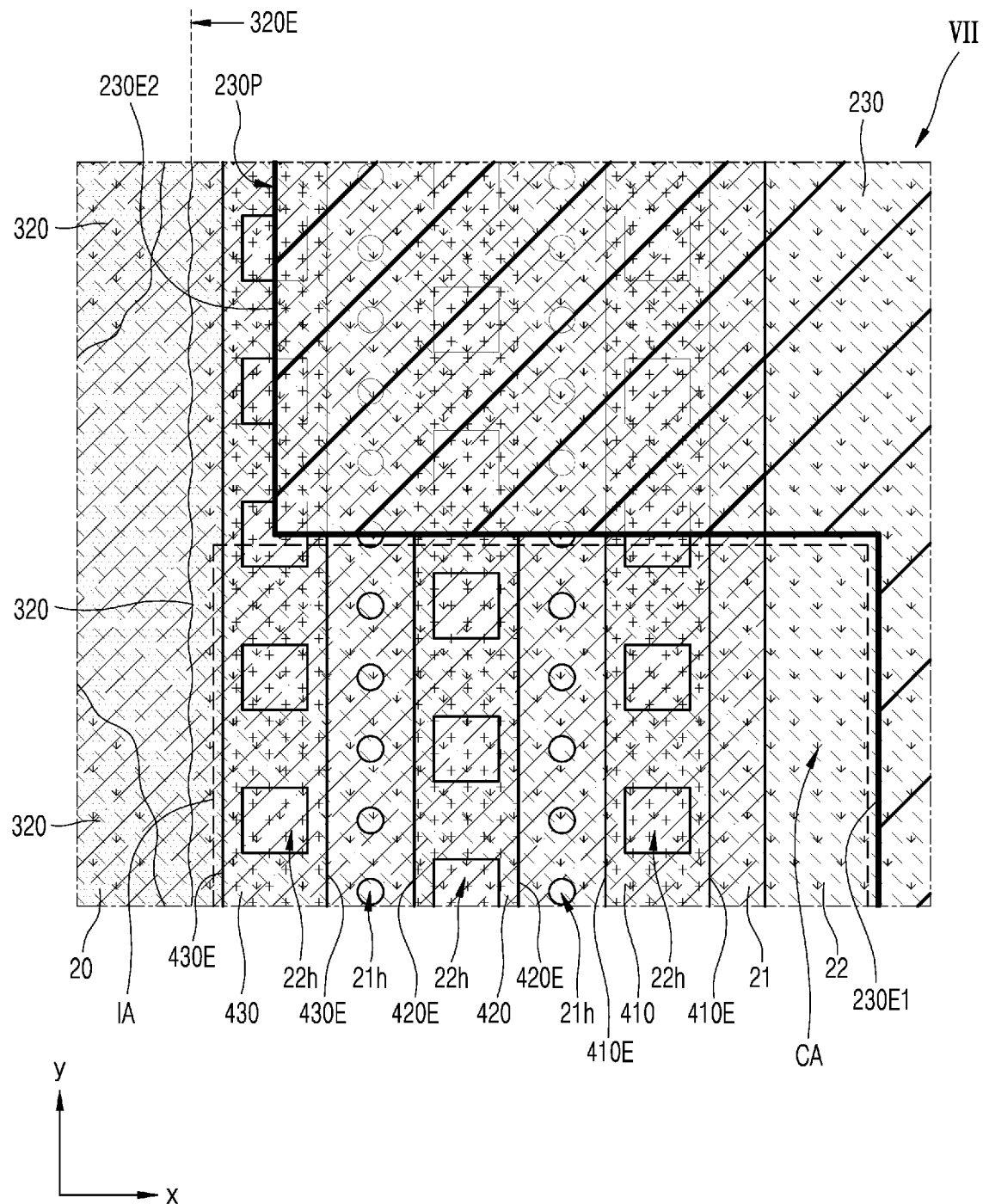
FIG. 7B is a plan view illustrating a part of a display panel according to a comparative example.

FIG. 7A is a plan view illustrating a portion of a display panel according to some example embodiments. FIG. 7B is a plan view illustrating a portion of a display panel according to a comparative example.

Referring to FIG. 7A, because the edge 230E of the opposite electrode 230 includes the concave edge 230E1, a portion of the barrier 400 may overlap the opposite electrode 230 and another portion of the barrier 400 may not overlap the opposite electrode 230. An area where the opposite electrode 230 and the barrier 400 do not overlap each other may be an inspection area IA for identifying a position of the edge 320E of the organic encapsulation layer 320.

As described above, in order to control a position of the organic encapsulation layer 320, the display panel 1 may be photographed by using an optical microscope during a manufacturing process of the display panel 1. For example, the photographing may be performed in a direction perpendicular to a surface of the substrate 100 of the display panel 1, and thus a planar image of the display panel 1 may be obtained. A portion of an optical image of the display panel 1 corresponding to the inspection area IA may have a relatively distinct shade. This is because the inspection area IA may correspond to the concave area CA, and the inspection area IA is an area where the barrier 400 does not overlap the opposite electrode 230, the common layers 221 and 223, and/or the capping layer 250 due to an uneven pattern of the opposite electrode 230, the common layers 221 and 223, and/or the capping layer 250.

An optical image obtained by using an optical microscope when an organic material of the organic encapsulation layer 320 is located in the inspection area IA during a process of forming the organic encapsulation layer 320 may have a shade difference that is reduced compared to an optical image before the organic encapsulation layer 320 is formed. Accordingly, a position of the edge 320E of the organic encapsulation layer 320 may be identified.

According to some example embodiments, the edge 320E of the organic encapsulation layer 320 may be located between two adjacent barriers 400 from among the plurality of barriers 400. In this regard, in FIG. 7A, the edge 320E of the organic encapsulation layer 320 is located between the third barrier 430 and the second barrier 420.

Because the organic encapsulation layer 320 covers edges 410E of the first barrier 410 and edges 420E of the second barrier 420, a shade of the edges 410E of the first barrier 410 and the edges 420E of the second barrier 420 may look unclear on an optical image. In contrast, because edges 430E of the third barrier 430 are not covered by the organic encapsulation layer 320, a shade of the edges 430E of the third barrier 430 may look clear on the optical image. Accordingly, it may be found that the edge 320E of the organic encapsulation layer 320 is located between the third barrier 430 and the second barrier 420.

Referring to FIG. 7B, in a comparative example, when an organic material of the organic encapsulation layer 320 is excessively applied or an error occurs in a position where the organic material is applied, the organic material of the organic encapsulation layer 320 may flow beyond the third barrier 430. In this case, the edge 320E of the organic encapsulation layer 320 may be located closer to an edge of the substrate than the third barrier 430. In this case, because the organic encapsulation layer 320 covers all of the edges 410E, 420E, and 430E of the plurality of barriers 400, all of shades of the edges 410E, 420E, and 430E of the plurality of barriers 400 may look somewhat unclear on an optical image. Accordingly, it may be determined whether there is a defect in forming the organic encapsulation layer 320.

When the thin-film encapsulation layer 300 is formed through the above embodiments, a position of the edge 320E of the organic encapsulation layer 320 may be more easily identified, and a position of the organic encapsulation layer 320 may be accurately and precisely controlled. Accordingly, the area of the peripheral area PA may be minimized, and a dead space of the display panel 1 may be reduced.

Although only a display panel has been mainly described, the present disclosure is not limited thereto. For example, a method of manufacturing the display panel may also fall within the scope of the present disclosure.

According to some example embodiments, because a liquid organic material for forming an organic encapsulation layer may be accurately controlled, an area occupied by a peripheral area in a display panel may be minimized or reduced. However, the scope of the present disclosure is not limited by the effect.

It should be understood that embodiments described herein should be considered in a descriptive sense only and not for purposes of limitation. Descriptions of features or aspects within each embodiment should typically be considered as available for other similar features or aspects in other embodiments. While one or more embodiments have been described with reference to the figures, it will be understood by those of ordinary skill in the art that various changes in form and details may be made therein without departing from the spirit and scope as defined by the following claims.

What is claimed is:

1. A display panel comprising:
    a display area and a peripheral area outside the display area;
    a substrate;
    a plurality of pixel electrodes spaced apart from each other on the substrate in the display area;
    a plurality of emission layers respectively arranged on the plurality of pixel electrodes;
    an opposite electrode on the plurality of emission layers and overlapping the display area; and
    a thin-film encapsulation layer on the opposite electrode and comprising at least one organic encapsulation layer and at least one inorganic encapsulation layer,
    wherein edges of the opposite electrode comprise a concave edge recessed from the peripheral area toward the display area and a convex edge protruding from the display area toward the peripheral area in a plan view, when seen in a direction perpendicular to a surface of the substrate.

2. The display panel of claim 1, further comprising a plurality of barriers spaced apart from each other in the peripheral area,
    wherein a first portion of a barrier from among the plurality of barriers overlaps the opposite electrode, and a second portion of the barrier does not overlap the opposite electrode.

3. The display panel of claim 2, wherein the at least one inorganic encapsulation layer directly contacts the second portion of the barrier.

4. The display panel of claim 2, further comprising a conductive layer in the peripheral area and comprising a plurality of holes,
    wherein the plurality of barriers overlap the plurality of holes.

5. The display panel of claim 4, further comprising a common power supply line in the peripheral area,
    wherein the opposite electrode and the common power supply line are electrically connected by the conductive layer.

6. The display panel of claim 4, wherein the conductive layer comprises a same material as the plurality of pixel electrodes.

7. The display panel of claim 2, further comprising a partition wall in the peripheral area that is outside the plurality of barriers.

8. The display panel of claim 7, wherein the edges of the opposite electrode are between the partition wall and the plurality of pixel electrodes in a plan view.

9. The display panel of claim 2, further comprising a pixel-defining layer on the plurality of pixel electrodes and comprising openings respectively corresponding to the plurality of pixel electrodes,
    wherein the plurality of barriers comprise a same material as the pixel-defining layer.

10. The display panel of claim 2, wherein an edge of the at least one organic encapsulation layer is between adjacent barriers from among the plurality of barriers.

11. The display panel of claim 10, wherein the convex edge of the opposite electrode is closer to an edge of the substrate than the edge of the at least one organic encapsulation layer.

12. The display panel of claim 10, wherein the concave edge of the opposite electrode is farther from an edge of the substrate than the edge of the at least one organic encapsulation layer.

13. The display panel of claim 1, wherein the at least one organic encapsulation layer overlaps the concave edge of the opposite electrode.

14. The display panel of claim 1, wherein the concave edge of the opposite electrode has a quadrangular shape, a trapezoidal shape, a triangular shape, a part of a circle, or a part of an ellipse in a plan view.

15. The display panel of claim 1, further comprising a common layer between the plurality of pixel electrodes and the opposite electrode,
    wherein edges of the common layer comprise a concave edge recessed from the peripheral area toward the display area and a convex edge protruding from the display area toward the peripheral area in a plan view.

16. The display panel of claim 15, wherein the edges of the common layer have a same shape as the edges of the opposite electrode in a plan view.

17. The display panel of claim 15, wherein concave areas respectively formed by the concave edge of the common layer and the concave edge of the opposite electrode overlap each other.

18. The display panel of claim 1, further comprising a capping layer between the opposite electrode and the thin-film encapsulation layer,
    wherein edges of the capping layer comprise a concave edge recessed from the peripheral area toward the display area and a convex edge protruding from the display area toward the peripheral area in a plan view.

19. The display panel of claim 18, wherein the edges of the capping layer have a same shape as the edges of the opposite electrode in a plan view.

20. The display panel of claim 18, wherein concave areas respectively formed by the concave edge of the capping layer and the concave edge of the opposite electrode overlap each other.

* * * * *